US012720834B2

(12) United States Patent
Lin et al.

(10) Patent No.: US 12,720,834 B2
(45) Date of Patent: Aug. 25, 2026

(54) INTEGRATED CIRCUIT STRUCTURE AND METHOD FOR FORMING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Shih-Yen Lin, New Taipei City (TW); Che-Jia Chang, Taichung City (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 464 days.

(21) Appl. No.: 18/151,963

(22) Filed: Jan. 9, 2023

(65) Prior Publication Data

US 2024/0105779 A1 Mar. 28, 2024

Related U.S. Application Data

(60) Provisional application No. 63/376,774, filed on Sep. 22, 2022.

(51) Int. Cl.
*H10D 62/80* (2025.01)
*H10D 30/01* (2025.01)
(Continued)

(52) U.S. Cl.
CPC ........... *H10D 62/882* (2025.01); *H10D 30/01* (2025.01); *H10D 62/8303* (2025.01);
(Continued)

(58) Field of Classification Search
CPC ............ C23C 14/0605; B32B 2457/00; B32B 2307/73; B32B 9/007; H10D 30/6757;
(Continued)

(56) References Cited

U.S. PATENT DOCUMENTS

2014/0106561 A1* 4/2014 Niyogi .............. H01L 21/76855 438/643
2016/0005881 A1* 1/2016 Fujii ................. H01L 21/02527 257/29
(Continued)

FOREIGN PATENT DOCUMENTS

CN 104211054 A * 12/2014

OTHER PUBLICATIONS

CN-104211054-A Translation (Year: 2014).*
(Continued)

*Primary Examiner* — Jessica S Manno
*Assistant Examiner* — Victor Joseph Lasasso
(74) *Attorney, Agent, or Firm* — Maschoff Brennan

(57) ABSTRACT

A method includes performing a first deposition process to form a first graphene layer over a substrate, the first deposition process being performed under a first temperature and a first pressure; performing a second deposition process to form a second graphene layer over the first graphene layer, the second deposition process being performed under a second temperature and a second pressure, in which the first temperature is higher than the second temperature, and the first pressure is lower than the second pressure; forming a gate structure over the second graphene layer; and forming source/drain contacts on opposite sides of the gate structure and electrically connected to the first and second graphene layers.

20 Claims, 24 Drawing Sheets

(51) Int. Cl.
*H10D 62/83* (2025.01)
*H10D 84/01* (2026.01)
*H10D 84/03* (2025.01)
*H10D 84/83* (2025.01)
*H10P 14/20* (2026.01)

(52) U.S. Cl.
CPC ....... *H10D 84/0149* (2025.01); *H10D 84/038* (2025.01); *H10D 84/83* (2025.01); *H10P 14/3406* (2026.01)

(58) Field of Classification Search
CPC .. H10D 30/01; H10D 30/472; H10D 30/6704; H10D 30/6734; H10D 30/6741; H10D 30/6739; H10D 30/6755; H10D 30/6748; H10D 30/6758; H10D 62/122; H10D 62/357; H10D 62/882; H10D 62/8303; H10D 30/6735; H10D 30/673; H10D 48/01; H10D 64/512; H01L 21/02527; H01L 23/53276; H01L 21/76867; H01L 21/76846; H01L 21/02175; H01L 21/02186; H01L 21/02205; H10K 10/486; H10K 85/20; H10W 20/033; H10W 20/4462; H10W 20/035; H10W 20/056; H10W 20/055; H10W 20/425; H10P 14/3406
See application file for complete search history.

(56) References Cited

U.S. PATENT DOCUMENTS

2018/0033892 A1* 2/2018 Yamane ............... H10D 86/423
2020/0243383 A1* 7/2020 Huang ............. H01L 23/53252
2022/0411918 A1* 12/2022 Das .................. C23C 16/45523

OTHER PUBLICATIONS

Fan et al (Year: 2019).*
Liu et al (Year: 2019).*
K. S. Novoselov et al., "Electric Field Effect in Atomically Thin Carbon Films", Science, vol. 306, p. 666-669 Oct. 22, 2004.
Hsuan-An Chen et al., "Scalable MoS2/graphene hetero-structures grown epitaxially on sapphire substrates for phototransistor applications", 2018 Semicond. Sci. Technol. 33 025007, 9pp.
Tingting Shen et al., "MoS2 for Enhanced Electrical Performance of Ultrathin Copper Films", ACS applied materials & Interfaces 11, pp. 28345-28351 (2019).

* cited by examiner 153
152
145
140
100
O1
O1
O1
110SD
110CH
110SD
130
124
122
120
110B
110A
110

Fig. 7A 210
205
145
140
100
110SD
110CH
110SD
154
153
152
150
130
124
122
120
110B
110A
110

INTEGRATED CIRCUIT STRUCTURE AND METHOD FOR FORMING THE SAME

PRIORITY CLAIM AND CROSS-REFERENCE

The present application claims priority to U.S. Provisional Application Ser. No. 63/376,774, filed Sep. 22, 2022, which is herein incorporated by reference.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 2A, 3, 4, 5, 6, 7A, 8A, 9, 10, 11, 12, 13, 14, 15, 16, 17, 18 and 19 are cross-sectional views of an integrated circuit structure in various stages of fabrication in accordance with some embodiments of the present disclosure.

DETAILED DESCRIPTION

Figure 1A:
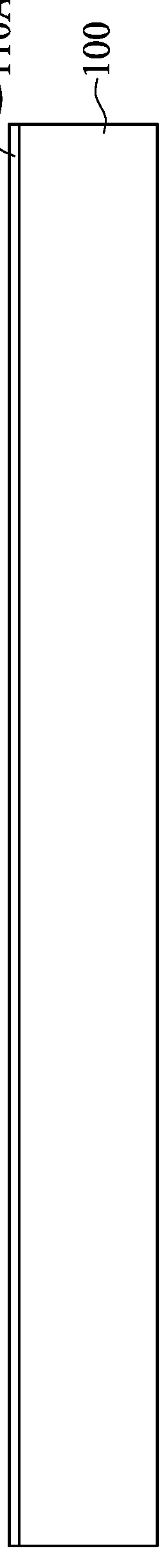

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A, 2A, 3, 4, 5, 6, 7A, 8A, 9, 10, 11, 12, 13, 14, 15, 16, 17, 18 and 19 are cross-sectional views of an integrated circuit structure in various stages of fabrication in accordance with some embodiments of the present disclosure. Although the views shown in FIGS. 1A, 2A, 3, 4, 5, 6, 7A, 8A, 9, 10, 11, 12, 13, 14, 15, 16, 17, 18 and 19 are described with reference to a method, it will be appreciated that the structures shown in FIGS. 1A, 2A, 3, 4, 5, 6, 7A, 8A, 9, 10, 11, 12, 13, 14, 15, 16, 17, 18 and 19 are not limited to the method but rather may stand alone separate of the method. Although FIGS. 1A, 2A, 3, 4, 5, 6, 7A, 8A, 9, 10, 11, 12, 13, 14, 15, 16, 17, 18 and 19 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Reference is made to FIG. 1A. Shown there is a substrate 100. In some embodiments, the substrate 100 may function to provide mechanical and/or structure support for features or structures that are formed in the subsequent steps of the process flow illustrated in FIGS. 1A, 2A, 3, 4, 5, 6, 7A, 8A, 9, 10, 11, 12, 13, 14, 15, 16, 17, 18 and 19. These features or structures may be parts or portions of an integrated circuit (e.g., transistor, interconnect structure, etc.) that may be formed on or over the substrate 100.

Generally, the substrate 100 illustrated in FIG. 1A may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates. In some other embodiments, the substrate 100 may include sapphire (e.g. crystalline $Al_2O_3$), e.g. a large grain or a single crystalline layer of sapphire or a coating of sapphire. As another example, the substrate 100 may be a sapphire substrate, e.g. a transparent sapphire substrate comprising, as an example, $\alpha$-$Al_2O_3$. Other elementary semiconductors like germanium may also be used for substrate 100.

A 2-D material layer 110A is formed over the substrate 100. In some embodiments, the 2-D material layer 110A is in direct contact with the top surface of the substrate 100. As used herein, consistent with the accepted definition within solid state material art, a "2-D material" may refer to a crystalline material consisting of a single layer of atoms. As widely accepted in the art, "2-D material" may also be referred to as a "monolayer" material. In this disclosure, "2-D material" and "monolayer" material are used interchangeably without differentiation in meanings, unless specifically pointed out otherwise. The 2-D material layer 110A may be 2-D materials of suitable thickness. In some embodiments, a 2-D material includes a single layer of atoms in each of its monolayer structure, so the thickness of the 2-D material refers to a number of monolayers of the 2-D material, which can be one monolayer or more than one monolayer. The coupling between two adjacent monolayers of 2-D material includes van der Waals forces, which are weaker than the chemical bonds between/among atoms within the single monolayer.

In some embodiments, the 2-D material layer 110A is made of graphene. In some embodiments, the 2-D material layer 110A is made of a single monolayer graphene. In some embodiments, exemplary technique for forming a graphene layer utilizes CVD (chemical vapor deposition) directly on the substrate 100. In some embodiments, the graphene layer may be formed by epitaxial graphene growth. For example, a silicon carbide dielectric is used as a seed layer to promote the epitaxial growth of the graphene on the substrate 100. In some other embodiments, graphene layer may be formed on a backing material (such as an adhesive tape), the backing material can be adhered to the substrate 100. Then, the backing material can be removed while leaving the graphene layer on the substrate 100. In some other embodiments, graphene is formed by reacting a metal film with silicon carbide to form a metal carbide. The metal carbide is annealed to produce a metal silicide and graphene from the remaining carbon. In yet other exemplary embodiments, graphene layer is deposited using an aqueous solution of graphene oxide.

The 2-D material layer 110A can be formed by a first deposition process. In some embodiments, the first deposition process is a CVD process. In the first deposition process, the substrate 100 is placed at the center of a 1 inch quartz tube furnace system. Then, the temperature is raised up to about 900° C. to about 1200° C. (e.g., 1050° C.) and the pressure is kept at about 8 torr to about 12 torr (e.g., 10 torr). After the reaching the growth temperature, a mixture gas (e.g., precursors) of Ar, $H_2$, and $C_2H_6$ is introduced into the furnace for graphene growth. In some embodiments, the flow rate of Ar is in a range from about 280 sccm to about 320 sccm (e.g., 300 sccm), the flow rate of $H_2$ is in a range from about 0 sccm to about 100 sccm (e.g., 50 sccm), and the flow rate of $C_2H_6$ is in a range from about 3 sccm to about 7 sccm (e.g., 5 sccm). In some embodiments, the duration of the growth process may be about 50 min to about 70 min (e.g., 60 min). After the growth process of the 2-D material layer 110A is completed, the substrate 100 is moved out from the furnace system.

Figure 1B:
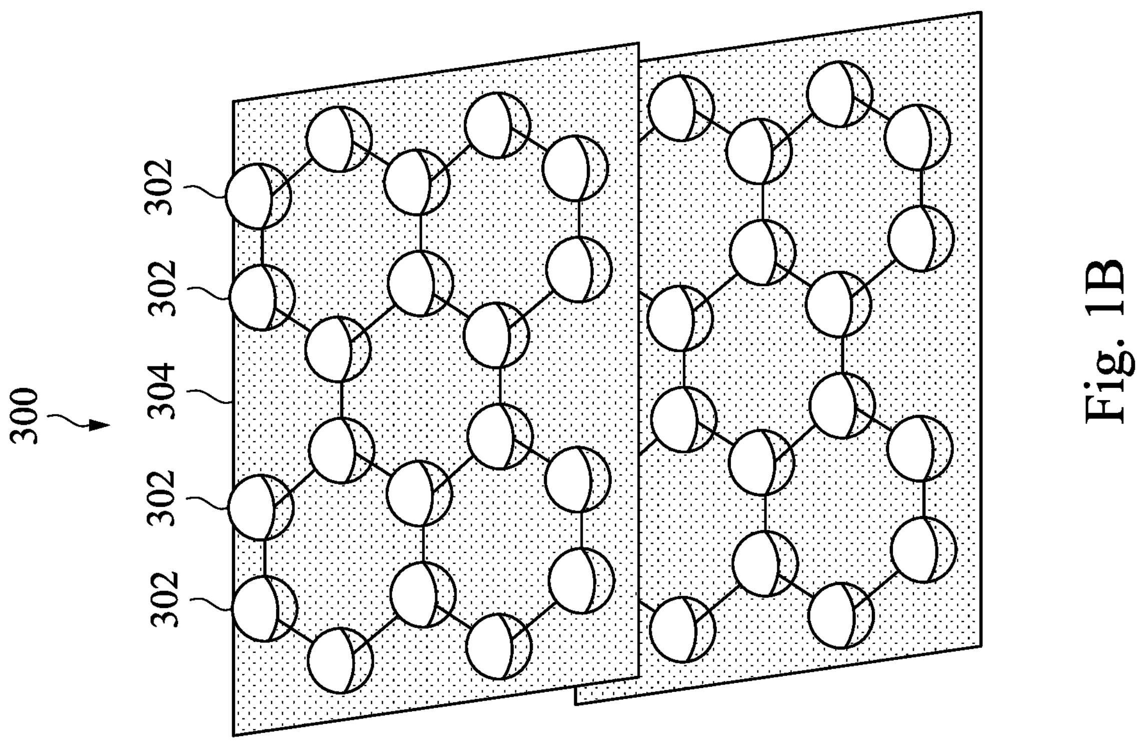
FIG. 1B illustrates a molecular diagram of graphene in accordance with some embodiments of the present disclosure.

FIG. 1B illustrates a molecular diagram 300 of graphene (e.g., the 2-D material layer 110A) according to some embodiments of the present disclosure. Graphene is an arrangement of carbon atoms 302 in mono-layers aligned along a single plane 304. As pure graphene has a high conductivity, it may be doped with one or more impurities to control mobility and induce a semiconductor-like response to a gate voltage. In various embodiments, the graphene is doped with titanium, chromium, iron, NH 3, potassium, and/or $NO_2$.

Figure 2A:
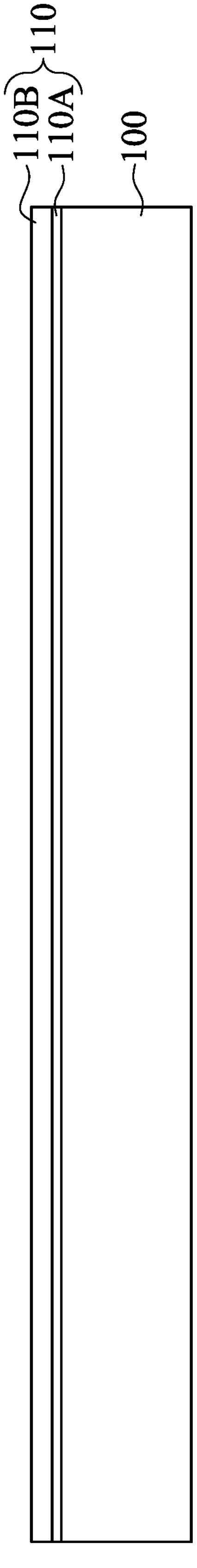

Reference is made to FIG. 2A. A 2-D material layer 110B is formed over the 2-D material layer 110A. The 2-D material layer 110A and the 2-D material layer 110B can be collectively referred to as a 2-D material layer 110. In some embodiments, the 2-D material layer 110B may be thicker than the 2-D material layer 110A.

The 2-D material layer 110B can be formed by a second deposition process, which includes different deposition conditions than the first deposition process as described in FIG. 1A. In some embodiments, the second deposition process is a CVD process. In the second deposition process, the substrate 100, where the 2-D material layer 110A is formed thereon, is placed at the center of a 1 inch quartz tube furnace system. Then, the temperature is raised up to about 850° C. to about 1000° C. (e.g. 950° C.) and the pressure is kept at about 45 torr to about 55 torr (e.g., 50 torr). After the reaching the growth temperature, a mixture gas of Ar, $H_2$, and $C_2H_6$ is introduced into the furnace for graphene growth. In some embodiments, the flow rate of Ar is in a range from about 280 sccm to about 320 sccm (e.g., 300 sccm), the flow rate of $H_2$ is in a range from about 50 sccm to about 300 sccm (e.g., 200 sccm), and the flow rate of $C_2H_6$ is in a range from about 3 sccm to about 7 sccm (e.g., 5 sccm). After the growth process of the 2-D material layer 110B is completed, the substrate 100 is moved out from the furnace system.

The difference between the first deposition process for forming the 2-D material layer 110A and the second deposition process for forming the 2-D material layer 110B is that, the growth temperature of the second deposition process is lower than the growth temperature of the first deposition process, the pressure of the second deposition process is higher than the pressure of the first deposition process, and the flow rate of $H_2$ of the second deposition process is greater than the flow rate of $H_2$ of the first deposition process. In some embodiments, the flow rates of Ar may be the same in the first and second deposition processes, and the flow rates of $C_2H_6$ may be the same in the first and second deposition processes.

In the present disclosure, the 2-D material layer 110 is formed by performing a first deposition process and a second deposition process, which include different deposition conditions. The results indicate that by reducing the growth temperature of the second deposition process, the graphene flake segregation can be significantly reduced. Moreover, with the same growth condition except for the higher hydrogen flow rate for the second deposition process, even less carbon clusters are observed for the sample. The results still indicate that a uniform graphene film (e.g., 2-D material layer 110B) can be grown on the first 2-D material layer (e.g., 2-D material layer 110A) after the modified growth procedure.

Figure 2C:
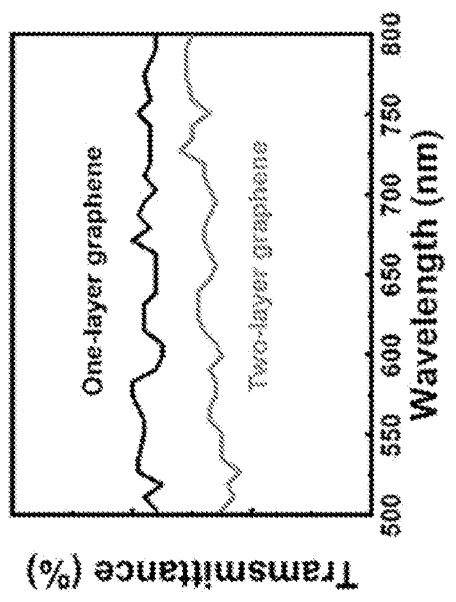
FIG. 2C illustrates experiment results in accordance with some embodiments of the present disclosure.
Figure 2B:
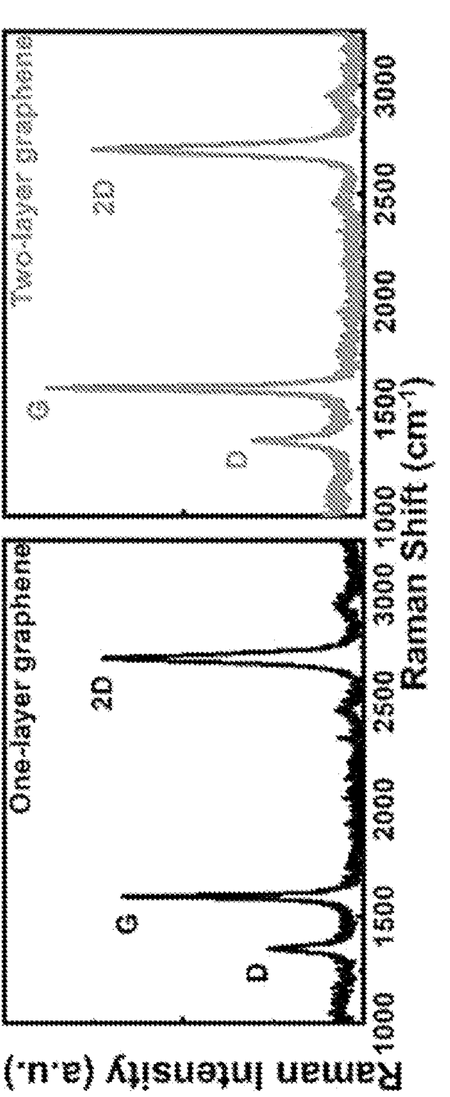
FIG. 2B illustrates experiment results in accordance with some embodiments of the present disclosure.

FIG. 2B illustrates experiment results of the structures shown in FIGS. 1A and 2A, respectively. In greater details, FIG. 2B shows Raman spectrum of two samples, in which the first sample is a one-layer graphene structure (e.g., only the 2-D material layer 110A), and the second sample is a two-layer graphene structure (e.g., the 2-D material layers 110A and 110B). As shown in the figure, the 2D/G peak ratios decrease from 1.08 to 0.85 with increasing graphene layers, which suggests that after the second graphene layer growth, increasing graphene layers are observed for the sample. On the other hand, a slight decreasing in the D/G peak ratio from 0.39 to 0.34 is observed with increasing layers. Although the slight D/G peak ration decreasing implies minor crystallinity improvement for the second graphene layer, the results still indicate that with the assist of van der Waals epitaxy, graphene layers with improved crystallinity can be grown on the initial graphene surfaces.

FIG. 2C illustrates experiment results of the structures shown in FIGS. 1A and 2A, respectively. To confirm the layer numbers of multi-layer graphene, one possible solution is through the measurement of the films' absorption. Since the light absorption for a mono-layer graphene is around 2% and is wavelength insensitive, it should be possible to determine the layer numbers of graphene films directly through their transmission spectrum. The transmission spectrums of two samples with one- and two-layer graphene layers in the wavelength range 500-800 nm are shown in FIG. 2C. For the sample with one-graphene layer (e.g., only the 2-D material layer 110A), the wavelength-insensitive absorption is around 2-3%, which indicate that a mono-layer graphene is obtained after one CVD growth cycle. For the sample with two-layer graphene (e.g., the 2-D material layers 110A and 110B), the absorption increases to around 3-4%, which indicates that after the second CVD growth cycle, a bi-layer graphene should be obtained from the sample.

Figure 2D:
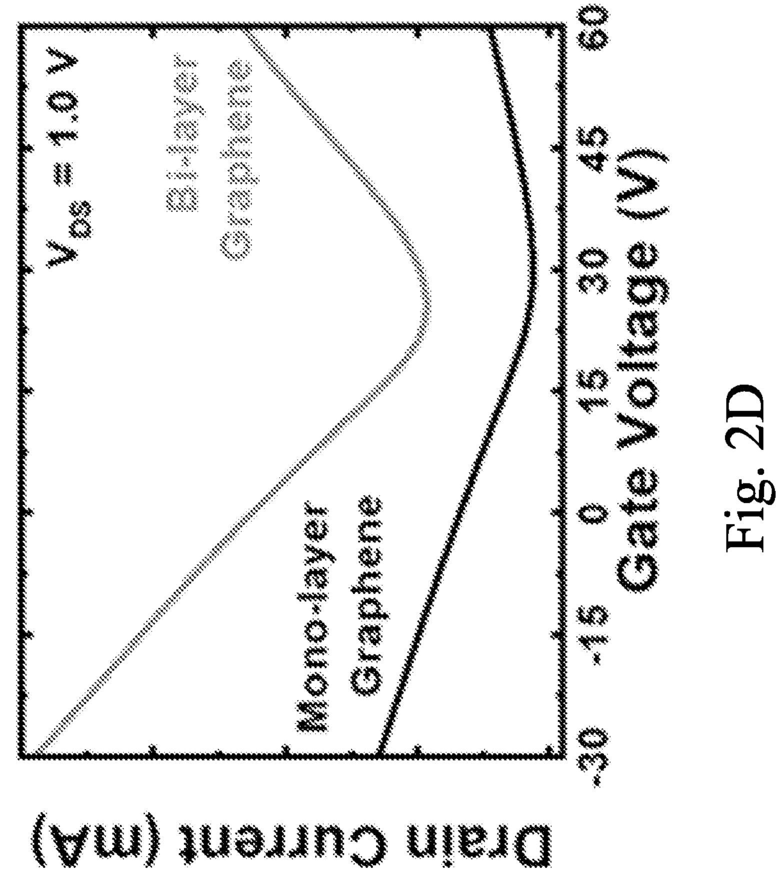
FIG. 2D illustrates experiment results in accordance with some embodiments of the present disclosure.

FIG. 2D illustrates experiment results of the structures shown in FIGS. 1A and 2A, respectively. In greater details, FIG. 2D illustrates transfer curves of two devices with mono-layer (e.g., only the 2-D material layer 110A) and bi-layer graphene (e.g., the 2-D material layers 110A and 110B) at $V_{DS}$=1.0 V. In some embodiments, the devices may be transistors with mono-layer and bi-layer graphene as channel layer. The results show that much higher drain currents are observed for the device with bi-layer graphene. The hole and electron mobility values of the two devices derived through the transfer curves are 108/43 (mono-layer) and 358/146 (bi-layer) $cm^2V^{-1}s^{-1}$, respectively. Higher hole and electron field-effect mobility values are observed for the device with the bi-layer graphene channel. The results have demonstrated that with the assist of van der Waals epitaxy on the first graphene surface, improved crystallinity can be obtained for the second graphene layer such that lower D/G peak ratio is observed for the graphene film. After fabricating the graphene films into transistors, higher drain currents and higher field-effect mobility values can be observed for the device with bi-layer graphene. The results have demonstrated that layered graphene growth can significantly improve the device performances of graphene transistors.

Figure 3:
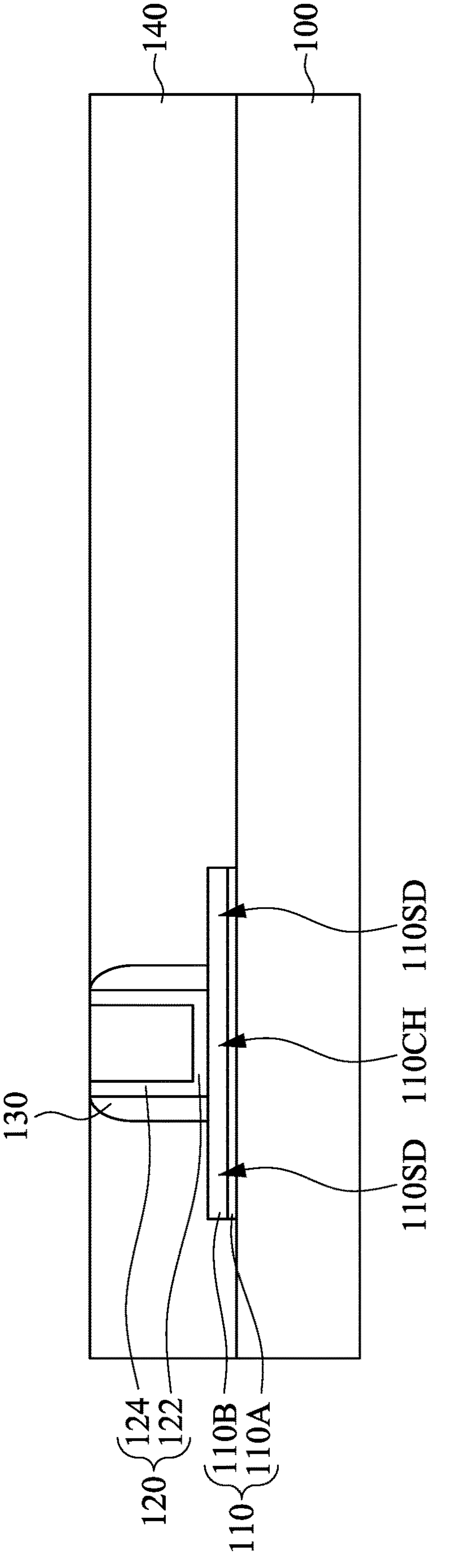

Reference is made to FIG. 3. The 2-D material layer 110 is patterned. In some embodiments, the 2-D material layer 110 may be patterned to cover a portion of the top surface of the substrate 100, while leaving other portions of the top surface of the substrate 100 exposed by the 2-D material layer 110. The 2-D material layer 110 may be patterned by suitable photolithography process, such as forming a patterned photoresist having openings exposing unwanted portions of the 2-D material layer 110, and etching away the unwanted portions of the 2-D material layer 110 to expose the substrate 100.

In some embodiments, the patterned 2-D material layer 110 may act as a channel layer, in which the 2-D material layer 110 may include a channel region 110CH and source/drain regions 110SD on opposite sides of the channel region 110CH. To control mobility and to produce a semiconductor-like response to a gate voltage, the 2-D material layer 110 may be doped by adding impurities. In some embodiments dopants such as boron (B) and nitrogen (N) are substituted for carbon atoms in the graphene matrix (atomic substitution). Additional or in the alternative, the regular structure of the graphene may be disrupted by adding dopants such as titanium, chromium, iron, $NH_3$, potassium, and $NO_2$ in order to produce a desired bandgap.

A gate structure 120 is formed over a channel region 110CH of the 2-D material layer 110. In some embodiments, the gate structure 120 includes a gate dielectric layer 122 and a gate electrode 124 over the gate dielectric layer 122. In some embodiments, the gate structure 120 illustrated in FIG. 3 may be a high-k metal gate (HKMG) gate structure that may be formed using a gate-last process flow. In a gate last process flow, a sacrificial dummy gate structure (not shown) is formed. The dummy gate structure may include a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarization (e.g., by CMP) is performed. A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. As described in greater detail below, the dummy gate structure may be replaced by the metal gate structure 120 as illustrated in FIG. 3.

Spacers 130 are formed, for example, aligned to the dummy gate structures. Spacers 130 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 130 along the sidewalls of the dummy gate structures.

In some embodiments, the source/drain regions 110SD are doped regions in the 2-D material layer 110. In some embodiments, the source/drain regions 110SD may comprise heavily-doped regions and relatively lightly-doped drain extensions, or LDD regions. Generally, the heavily-doped regions are spaced away from the gate structure 120 by the spacers 130, whereas the LDD regions may be formed prior to forming spacers 130 and, hence, extend under the spacers 130 and, in some embodiments, extend further into 2-D material layer 110 below the gate structure 120. These doped regions may be formed, for example, by implanting n-type or p-type dopants (e.g., As, P, B, In, or the like) into source/drain regions 110SD of the 2-D material layer 110 by using an ion implantation process, except for channel region 110CH of the 2-D material layer 110 directly below the gate structure 120; or by first depositing a dopant source layer over source/drain regions of the 2-D material layer 110 and then diffusing dopants from the dopant source layer into the 2-D material layer 110 by annealing. Accordingly, the gate structure 120, the channel region 110CH of the 2-D material layer 110, and the source/drain regions 110SD of the 2-D material layer 110 may collectively work as a transistor.

A first interlayer dielectric (ILD) 140 is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer 140. The gate structure 120 may then be formed by first removing the dummy gate structures using one or more etching techniques, thereby creating trenches between respective spacers 130. Next, a replacement gate dielectric layer 122 including one more dielectrics, followed by a replacement conductive gate electrode 124 including one or more conductive materials, are deposited to completely fill the recesses. Excess portions of the gate dielectric layer 122 and gate electrode 124 may be removed from over the top surface of first ILD layer 140 using, for example a CMP process. The resulting structure, as illustrated in FIG. 3, may be a substantially coplanar surface including an exposed top surface of first ILD layer 140, spacers 130, and remaining portions of the gate structure 120 inlaid between respective spacers 130.

The gate dielectric layer 122 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof.

In some embodiments, the gate electrode 124 may be a multilayered metal gate stack including a barrier layer, a work function layer, and a gate-fill layer formed successively on top of gate dielectric layer 122. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may include metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

Figure 4:
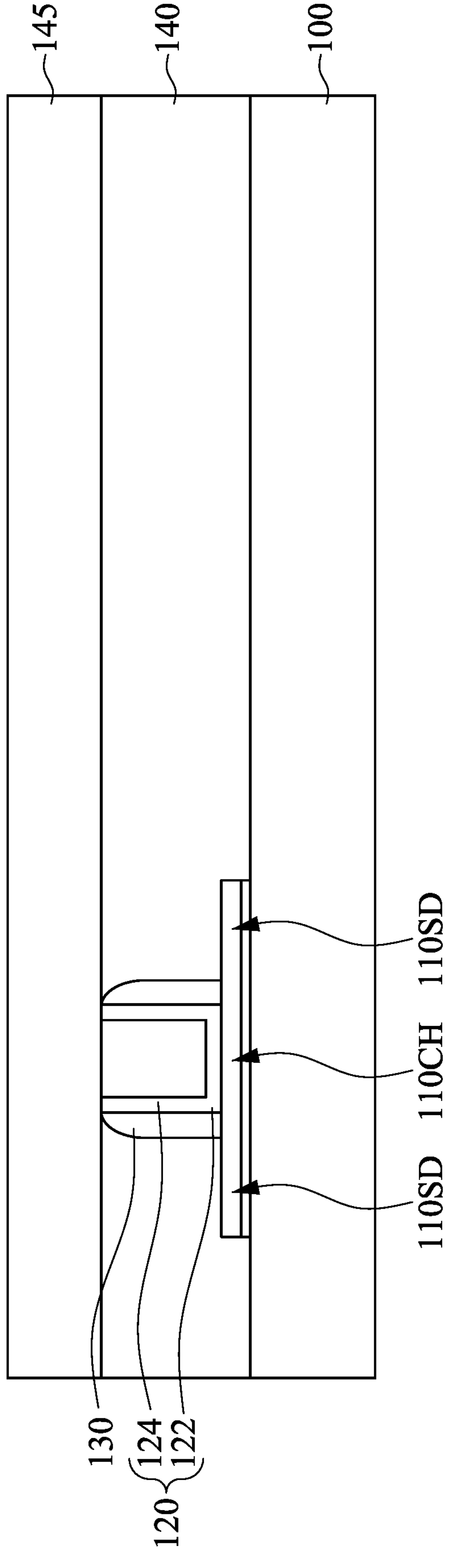

Reference is made to FIG. 4. A second ILD layer 145 may be deposited over the first ILD layer 140. In some embodiments, the insulating materials to form the first ILD layer 140 and the second ILD layer 145 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 140 and the second ILD layer 145 may be deposited using any suitable method, such as CVD, physical vapor deposition (PVD), ALD, PEALD, PECVD, SACVD, FCVD, spin-on coating, and/or the like, or a combination thereof.

Figure 5:
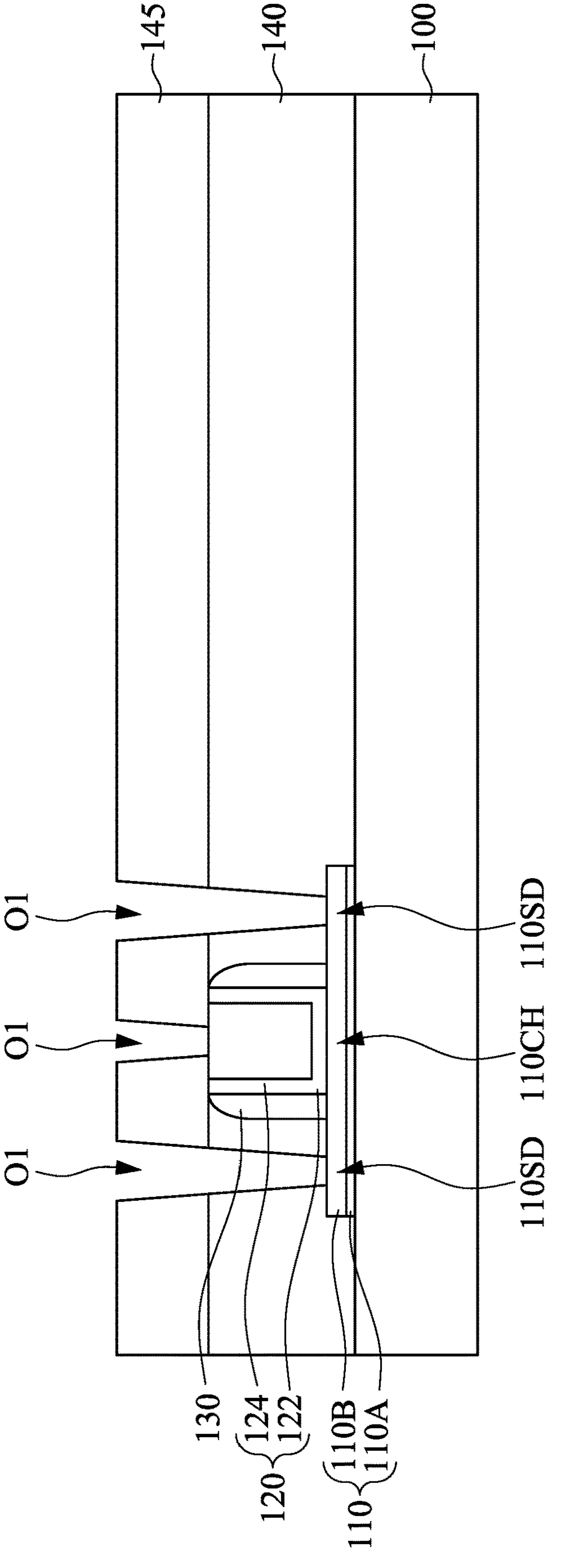

Reference is made to FIG. 5. An etching process is performed to the structure of FIG. 2, so as to form openings O1 in the second ILD layer 145 and the first ILD layer 140. In some embodiments, the openings O1 expose the source/drain regions 110SD of the 2-D material layer 110 and the gate structure 120.

Figure 6:
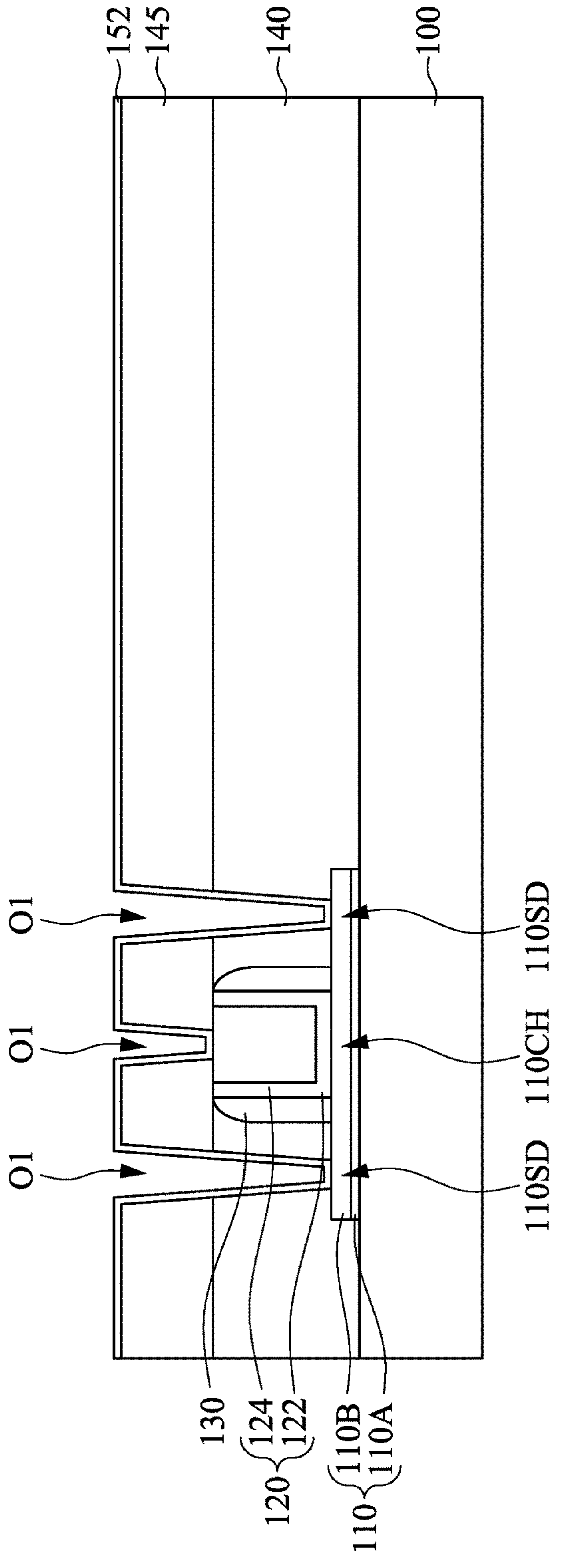

Reference is made to FIG. 6. A 2-D material layer 152 is formed over the second ILD layer 145 and lining the openings O1. In some embodiments, the 2-D material layer 152 may be made of graphene. In some embodiments, the 2-D material layer 152 may be similar to the 2-D material layer 110A, and can be formed by a similar method as described above with respect to the 2-D material layer 110A. In other embodiments, the 2-D material layer 152 may be similar to the 2-D material layer 110, which includes the 2-D material layers 110A and 110B, and can be formed by a similar method as described above with respect to the 2-D material layer 110.

In some embodiments, exemplary technique for forming a graphene layer utilizes CVD (chemical vapor deposition). In some embodiments, the graphene layer may be formed by epitaxial graphene growth. For example, a silicon carbide dielectric is used as a seed layer to promote the epitaxial growth of the graphene over the second ILD layer 145 and in the openings O1. In some other embodiments, graphene layer may be formed on a backing material (such as an adhesive tape), the backing material can be adhered to the substrate 100. Then, the backing material can be removed while leaving the graphene layer on the substrate 100. In some other embodiments, graphene is formed by reacting a metal film with silicon carbide to form a metal carbide. The metal carbide is annealed to produce a metal silicide and graphene from the remaining carbon. In yet other exemplary embodiments, graphene layer is deposited using an aqueous solution of graphene oxide.

Figure 7A:
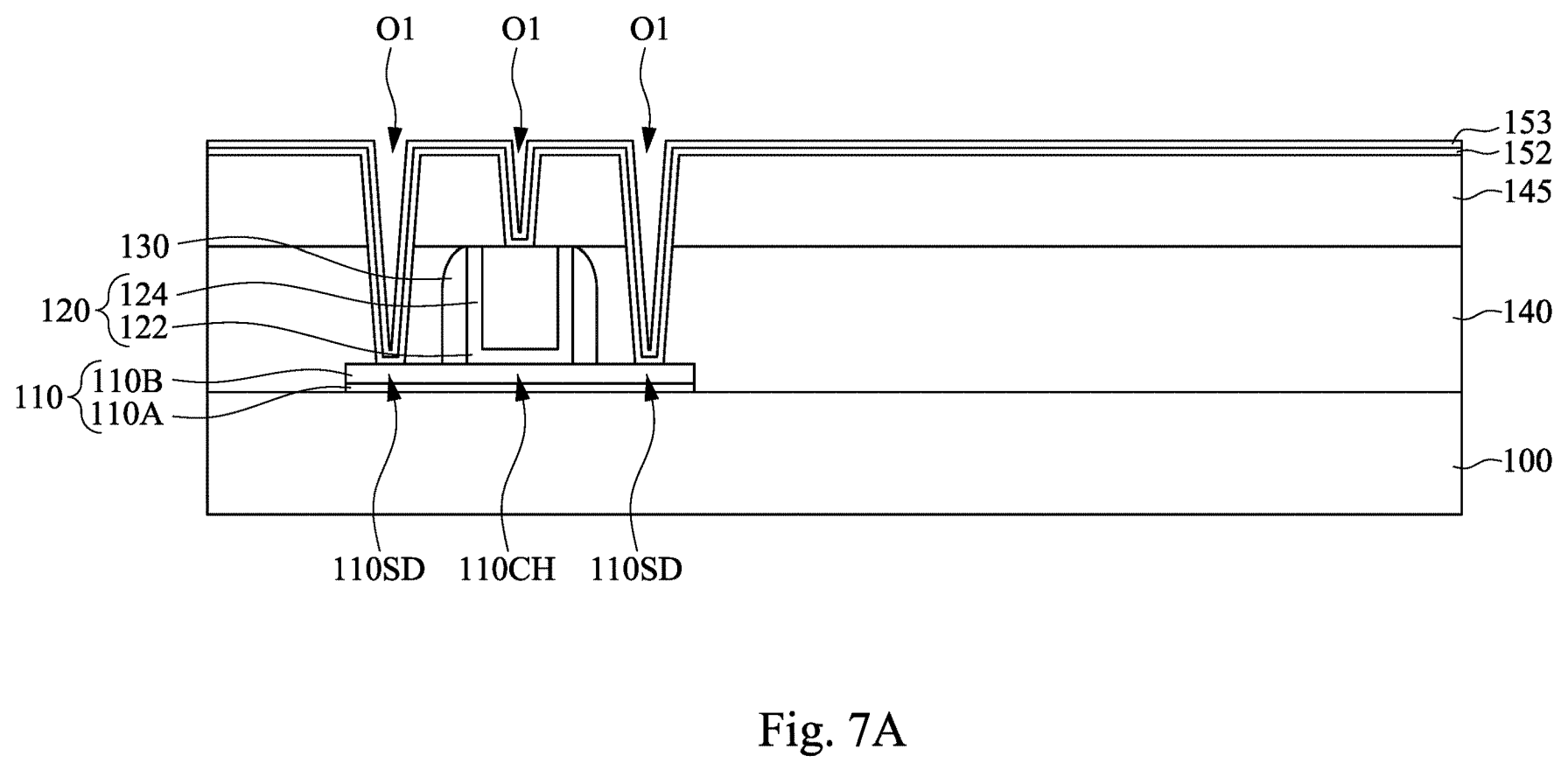

Reference is made to FIG. 7A. A 2-D material layer 153 is formed over the 2-D material layer 152. In some embodiments, the 2-D material layer 153 is made of a different 2-D material than the 2-D material layer 152. For example, the 2-D material layer 153 may be made of transition metal dichalcogenides (TMDs). In some embodiments, the 2-D material layer 153 is a metal-containing 2-D material layer, while the 2-D material layer 153 is a metal-free 2-D material layer. In some embodiments, the 2-D material layer 153 is thicker than the 2-D material layer 152. In some embodiments, both of the 2-D material layers 152 and 153 are a single monolayer 2-D material.

Figure 7B:
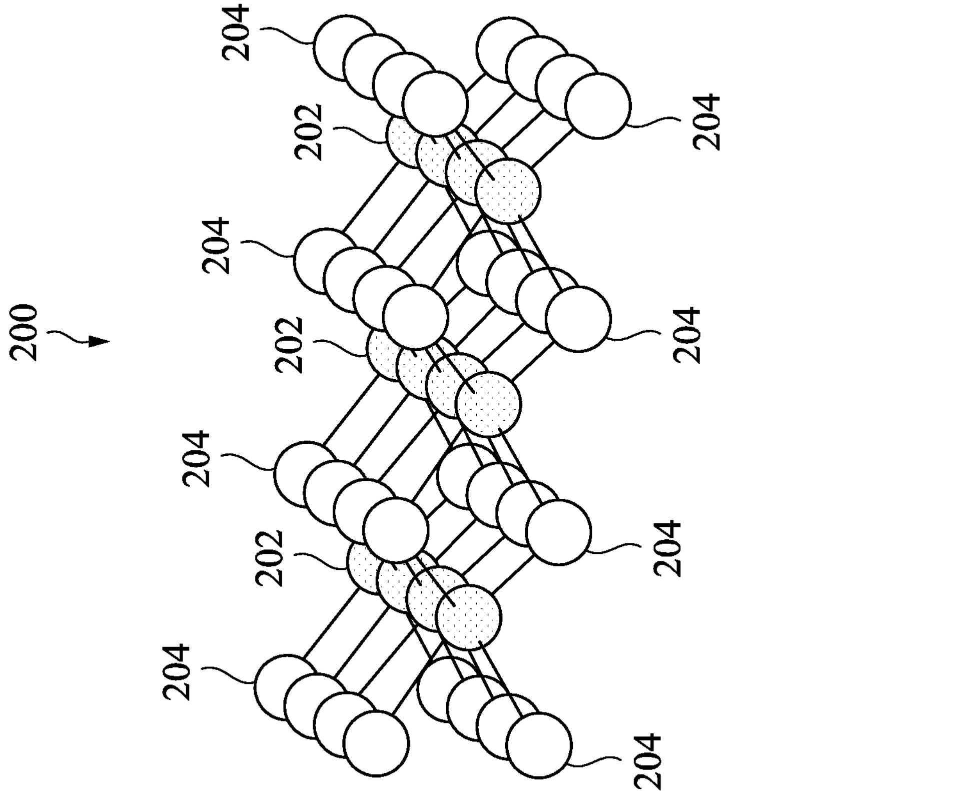
FIG. 7B illustrates a schematic view of a mono-layer of a TMD in accordance with some embodiments of the present disclosure.

FIG. 7B illustrates a schematic view of a mono-layer 200 of an example TMD in accordance with some example embodiments. In FIG. 7B, the one-molecule thick TMD material layer includes transition metal atoms 202 and chalcogen atoms 204. The transition metal atoms 202 may form a layer in a middle region of the one-molecule thick TMD material layer, and the chalcogen atoms 204 may form a first layer over the layer of transition metal atoms 202, and a second layer underlying the layer of transition metal atoms 202. The transition metal atoms 202 may be W atoms or Mo atoms, while the chalcogen atoms 204 may be S atoms, Se atoms, or Te atoms. Throughout the description, the illustrated cross-bonded layers including one layer of transition metal atoms 202 and two layers of chalcogen atoms 204 in combination are referred to as a mono-layer 204 of TMD.

In some embodiment where the 2-D material layer 153 includes TMD monolayers, the TMD monolayers include molybdenum disulfide ($MoS_2$), tungsten disulfide ($WS_2$), tungsten diselenide ($WSe_2$), or the like.

In some embodiments where the 2-D material layer 153 is made of $MoS_2$, a $MoO_3$ film may be deposited over a graphene layer (e.g., the 2-D material layer 152) by using thermal evaporation. The deposition rate is kept at about 0.1 nm/sec. with the $MoO_3$ deposition thickness about 1.0 nm. After the $MoO_3$ deposition procedure, the sulfurization procedure is performed. The substrate is placed in the center of a furnace for sulfurization. Before sulfurization, the tube is pumped down to about $5\times10^{-3}$ torr. During the sulfurization procedure, about 150 sccm to 250 sccm (e.g., 200 sccm) Ar gas was used as carrier gas, while the furnace pressure was kept at about 40 torr to about 60 torr (e.g., 50 torr). The growth temperature for the samples was kept at about 800° C. to about 900° C. (e.g., 850° C.) with the sulfur (S) powder placed on the upstream of the gas flow. The evaporation temperature for the S powder is kept at about 150° C. to about 170° C. (e.g., 160° C.). In some other embodiments, other physical deposition techniques such as e-gun evaporation, RF sputtering and pulse laser deposition (PLD) may also be adopted for the depositions of the transition metals.

Figure 8A:
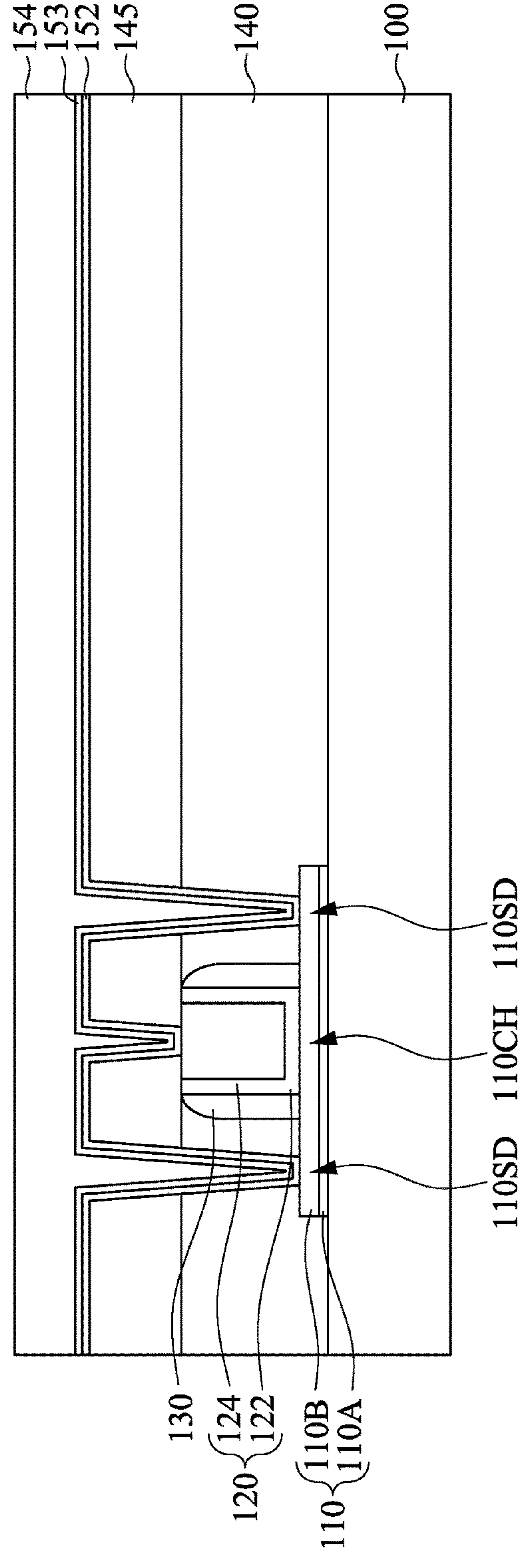

Reference is made to FIG. 8A. An electrode layer 154 is formed over the 2-D material layer 153 and overfilling the openings O1. In some embodiments, the electrode layer 154 may be copper (Cu), ruthenium (Ru), iridium (Ir), rhodium (Rh), gold (Au), silver (Ag), platinum (Pt), tungsten (W), or other suitable metals. In some embodiments, the electrode layer 154 may be deposited using thermal evaporation, e-beam deposition, e-gun evaporation, sputtering, or other suitable deposition methods.

In some embodiments where the electrode layer 154 is made of Cu, the Cu film can be formed over a $MoS_2$/graphene hetero-structure (e.g., the 2-D material layers 152 and 153) by e-beam deposition. The Cu film can be deposited on the 2-D material layer 153 (e.g., a $MoS_2$ surface) at room temperature with a deposition rate about 0.1 Å/sec. to about 1.5 Å/sec. (e.g., 0.1 Å/sec). In a HRTEM image, a polycrystalline Cu film can be observed on a $MoS_2$ surface, which indicates a good wettability of Cu on the $MoS_2$ surface. Compared with a 4 nm liner (Ta)/barrier (TaN) stack, the thickness of mono-layer $MoS_2$/mono-layer graphene can be greatly decreased to about 1 nm, which will leave more room for Cu filling in interconnects and further size shrinkage may be possible by using 2-D materials in place of the liner (Ta)/barrier (TaN) stack. With different thicknesses of Cu films, the resistivity values gradually increase from 3.67 (30 nm of Cu film) to 7.7 (10 nm of Cu film) μΩ·cm. With no significant resistivity increasing with reduced film thicknesses, the thin $MoS_2$/graphene heterostructure as the liner/barrier stack can be advantageous for further interconnect scaling. The 5.23μΩ·cm resistivity of 15 nm Cu film in this work is close to the value of 5 μΩ·cm of the Cu film with the same thickness deposited on exfoliated $MoS_2$ flakes. Since the grown $MoS_2$ film is of polycrystalline film, the results demonstrate that the crystallinity of the $MoS_2$ film will not influence the wettability of Cu on $MoS_2$ surfaces, which may further simply the fabrication procedure of the $MoS_2$/graphene. In some embodiments, the temperature of the deposition process is in a range from about room temperature (e.g., about 25° C. to about 27° C.) to about 400° C. In some other embodiments, during the deposition of the electrode layer 154, the temperature of the deposition process can vary from room temperature (e.g., about 25° C. to about 27° C.) to a high temperature in a range from about 50° C. to about 200° C., and then decreases from the high temperature to room temperature.

In some embodiments where the electrode layer 154 is made of Cu (e.g., about 20 nm of Cu film), the sheet resistance of the electrode layer 154 is about 4.44 μΩ·cm, which is much lower than the sheet resistance of a Cu film directly formed on a graphene. The results suggest that the van der Waals epitaxy may help the lateral growth of continuous Cu films on a TMD surface (e.g., $MoS_2$ surface) and enhance the wettability of copper on a TMD material surface.

Figure 8B:
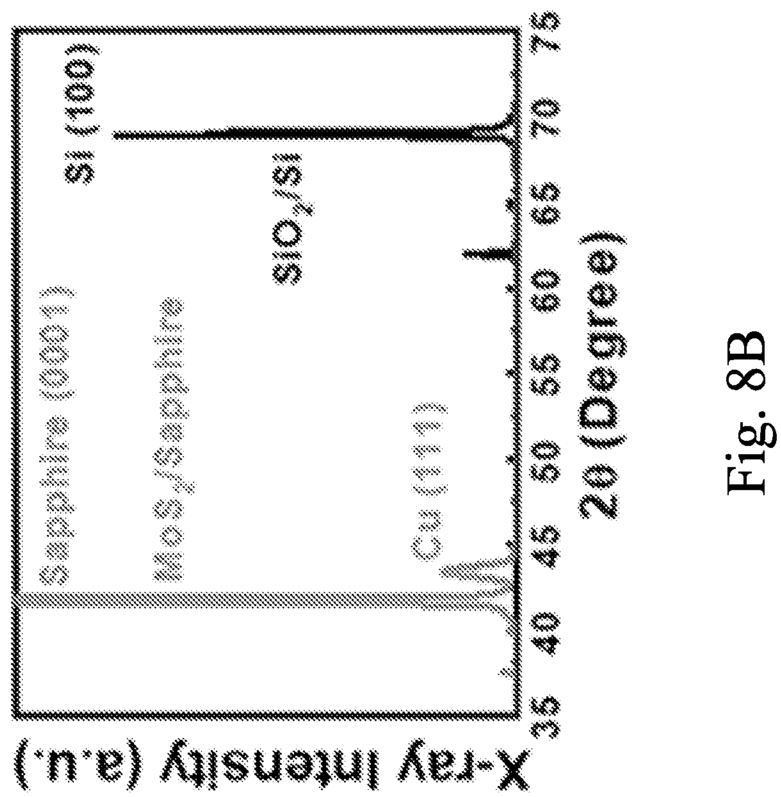
FIG. 8B illustrates experiment results in accordance with some embodiments of the present disclosure.

FIG. 8B illustrates experiment results in accordance with some embodiments of the present disclosure. Shown there are two samples with a 20 nm Cu grown on $SiO_2$/Si and a 20 nm Cu grown on tri-layer $MoS_2$/sapphire substrates. It can be seen that only Si (100) peak is observed for the sample grown on the $SiO_2$/Si substrate, an additional Cu (111) peak is observed for the sample grown on $MoS_2$ surfaces. Besides the lateral growth of Cu films, the van der Waals epitaxy may also help to improve the crystallinity of the metal films. This suggests that single-crystal Cu grains are observed on $MoS_2$ surface, which indicates that improved crystallinity of Cu film is obtained on $MoS_2$ surface with the assistance of van der Waals epitaxy on 2-D material surface.

Figure 9:
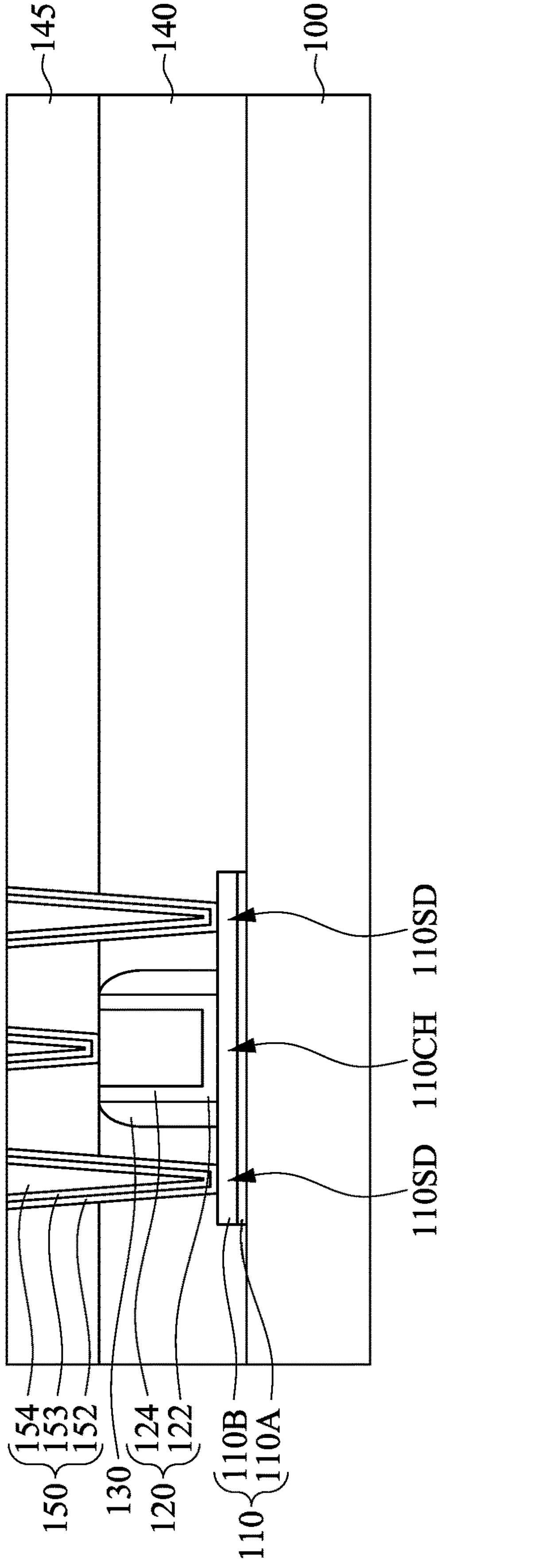

In some embodiments of the present disclosure, the 2-D material layer 152 can act as a diffusion barrier layer of a contact plug (e.g., the contact plug 150 of FIG. 9). In some embodiments where the 2-D material layer 152 is made of graphene, the ability of graphene layers to block the copper diffusion will be critical. In an experiment, a Cu film is formed over a bi-layer graphene. To demonstrate the bi-layer graphene's ability to block copper diffusion, 20 nm copper is deposited on the bi-layer graphene sample with two CVD growth cycles at 200° C. In a HRTEM image, clear bilayer graphene is observed after the copper deposition at 200° C. Moreover, in an element mapping image, clear separation between C and Cu signals are observed, which suggests that graphene can effectively block Cu diffusion at high growth temperatures. In this case, graphene may act as the diffusion barrier layer for interconnect purpose.

Reference is made to FIG. 9. A chemical mechanism polishing (CMP) process is performed to remove excess materials of the 2-D material layers 152,153, and the electrode layer 154. After the CMP process, the top surface of the second ILD layer 145 is exposed. In some embodiments, portions of the 2-D material layers 152,153, and the electrode layer 154 in each opening O1 (see FIG. 8A) can be collective referred to as a contact plug 150. In some embodiments, the contact plugs 150 in contact with the source/drain regions 110SD of the 2-D material layer 110 can be referred to as source/drain contacts. On the other hand, the contact plug 150 in contact with the gate structure 120 can be referred to as gate via.

Figure 10:
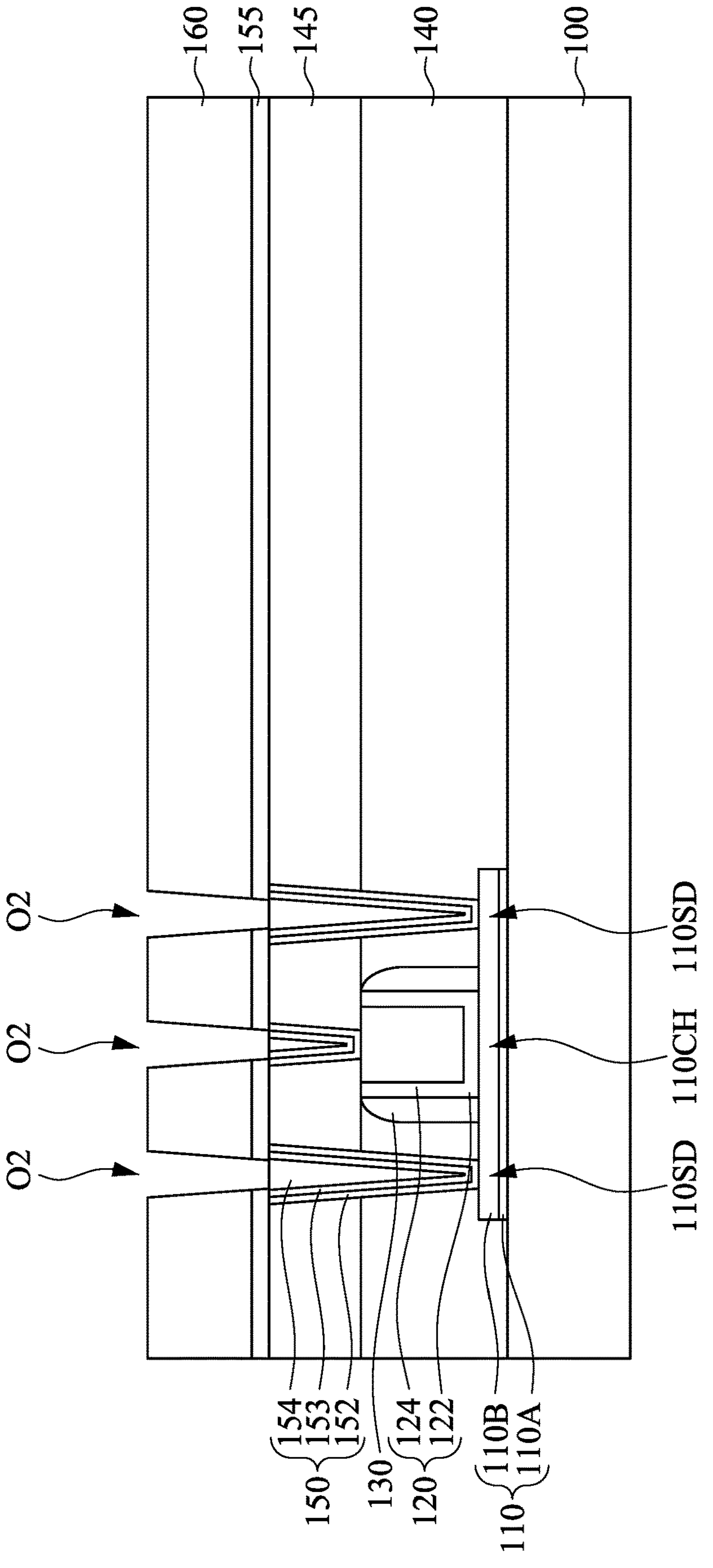

Reference is made to FIG. 10. An etch stop layer 155 is formed over the second ILD layer 145, and an inter-metal dielectric (IMD) layer 160 is formed over the etch stop layer 155. In some embodiments, the etch stop layer 155 may be in contact with the 2-D material layers 152 and 153 of each contact plug 150. In some embodiments, the etch stop layer 155 includes one or more insulator layers (e.g., SiN, SiC, SiCN, SiCO, CN, combinations thereof, or the like) having an etch rate different than an etch rate of the overlying IMD layer 160. In some embodiments, the IMD layer 160 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The etch stop layer 155 and the IMD layer 160 may be deposited using suitable method, such as CVD, physical vapor deposition (PVD), ALD, PEALD, PECVD, SACVD, FCVD, spin-on, and/or the like, or a combination thereof.

The etch stop layer 155 and the IMD layer 160 are patterned to form openings O2 that expose the contact plugs 150. For example, a patterned mask is formed over the IMD layer 160, and etching process is performed to remove unwanted portions of the etch stop layer 155 and the IMD layer 160 by using the patterned mask as an etch mask.

Figure 11:
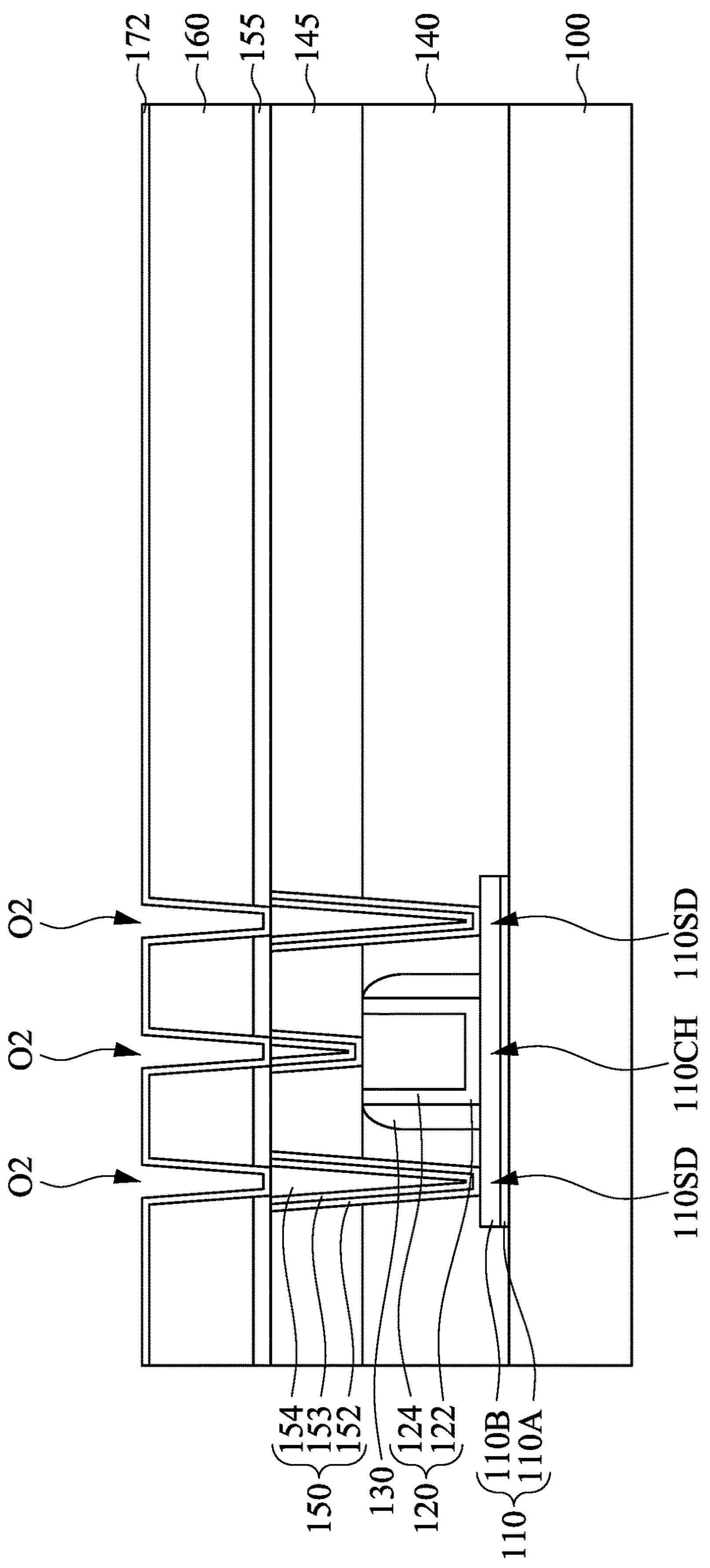

Reference is made to FIG. 11. A 2-D material layer 172 is formed over the second ILD layer 145 and lining the openings O2. In some embodiments, the material and the formation method of the 2-D material layer 172 may be similar to or the same as those described with respect to the 2-D material layer 152, and thus relevant details will not be repeated for brevity.

Figure 12:
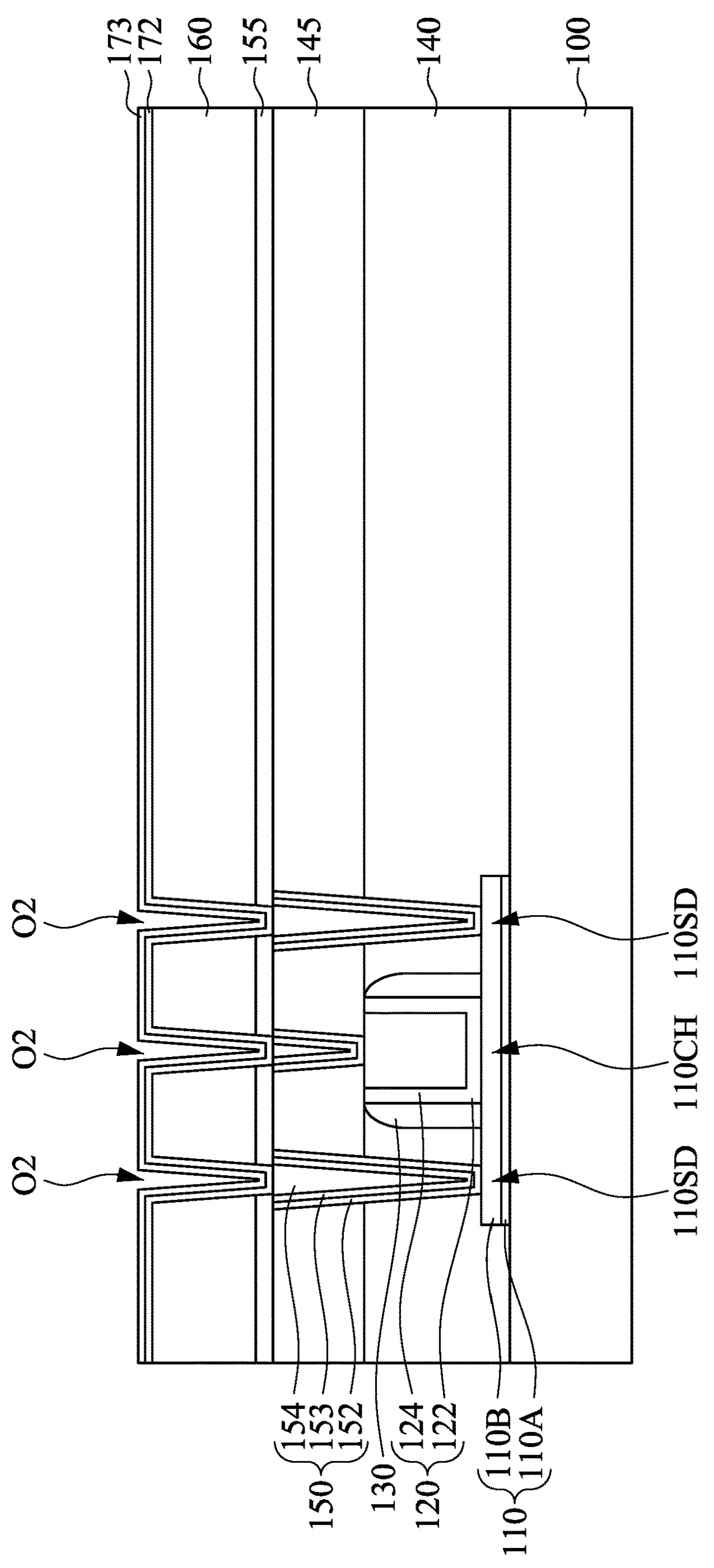

Reference is made to FIG. 12. A 2-D material layer 173 is formed over the 2-D material layer 172. In some embodiments, the material and the formation method of the 2-D material layer 173 may be similar to or the same as those described with respect to the 2-D material layer 153, and thus relevant details will not be repeated for brevity.

Figure 13:
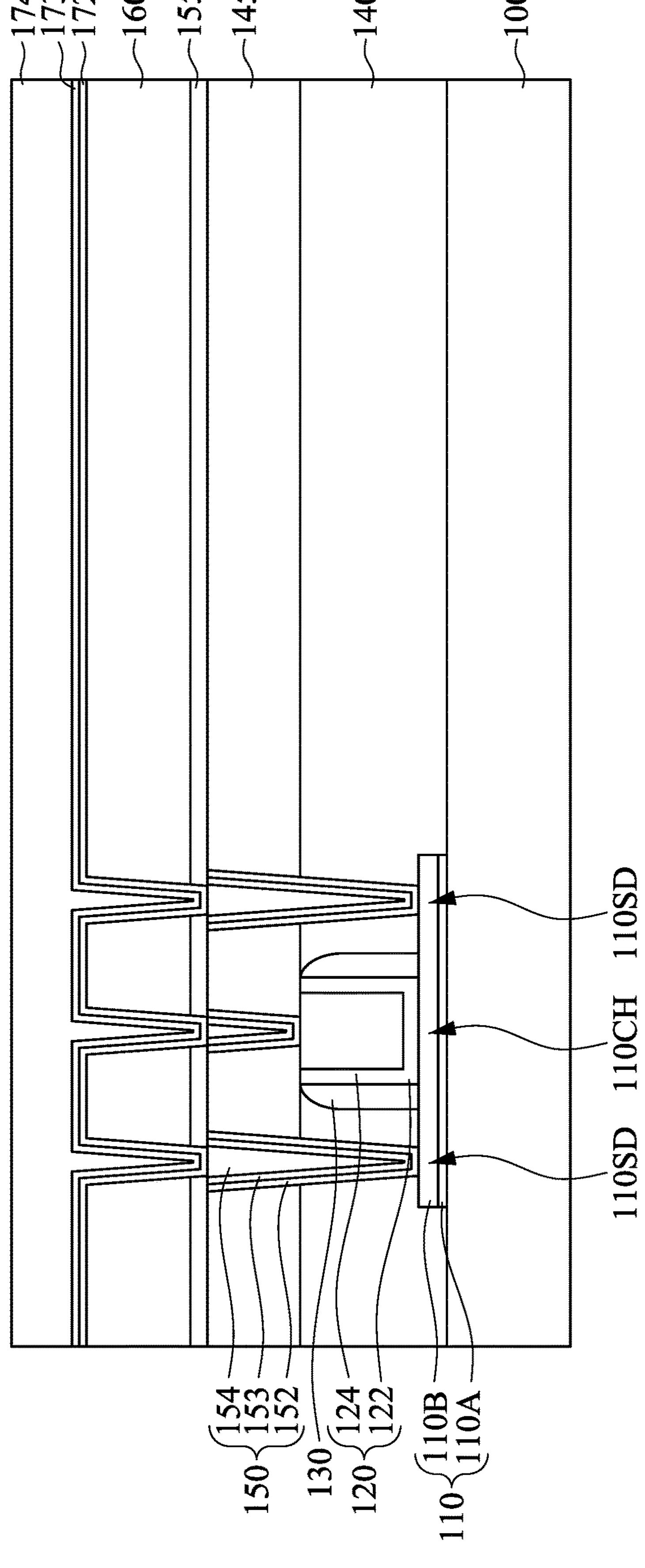

Reference is made to FIG. 13. An electrode layer 174 is formed over the 2-D material layer 173 and overfilling the openings O2. In some embodiments, the electrode layer 174 may be copper (Cu), ruthenium (Ru), iridium (Ir), rhodium (Rh), gold (Au), silver (Ag), platinum (Pt), tungsten (W), or other suitable metals. In some embodiments, the electrode layer 174 may be deposited using thermal evaporation, e-gun evaporation, sputtering, or other suitable deposition methods.

Figure 14:
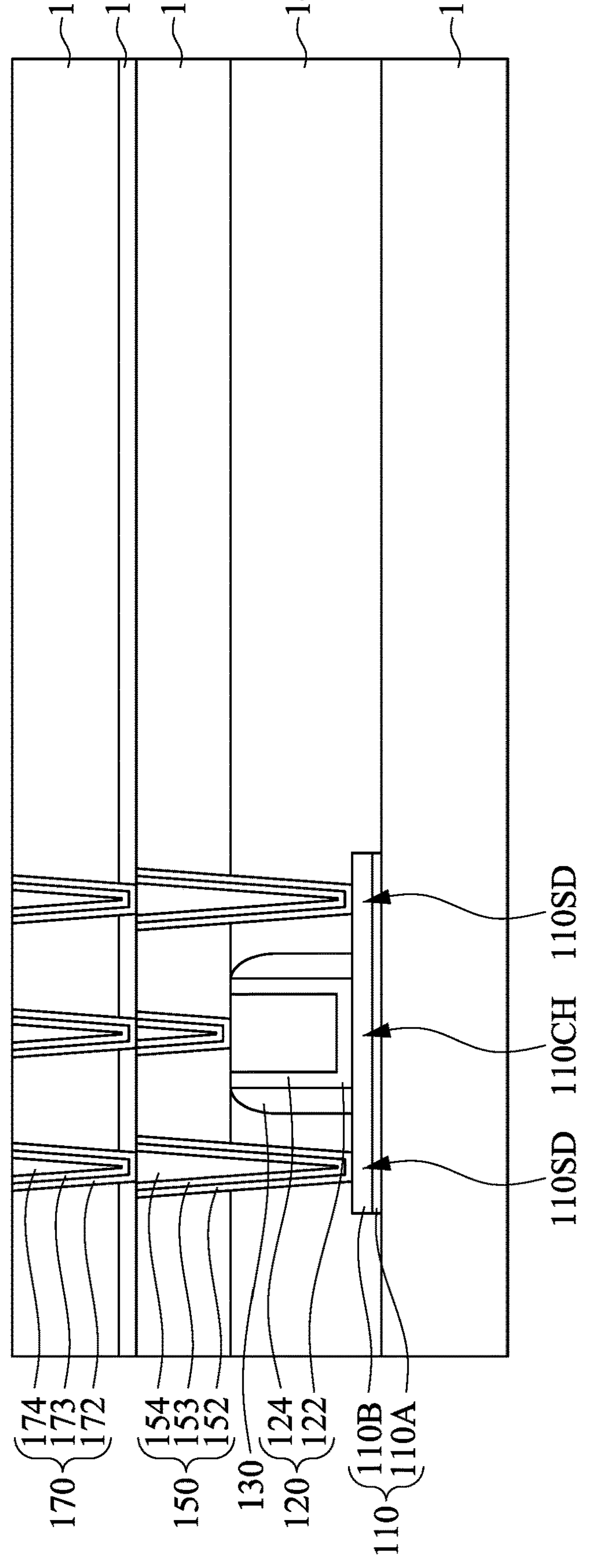

Reference is made to FIG. 14. A chemical mechanism polishing (CMP) process is performed to remove excess materials of the 2-D material layers 172,173, and the electrode layer 174. After the CMP process, the top surface of the IMD layer 160 is exposed. In some embodiments, portions of the 2-D material layers 152,153, and the electrode layer 174 in each opening O2 (see FIG. 13) can be collective referred to as a via structure 170.

Figure 15:
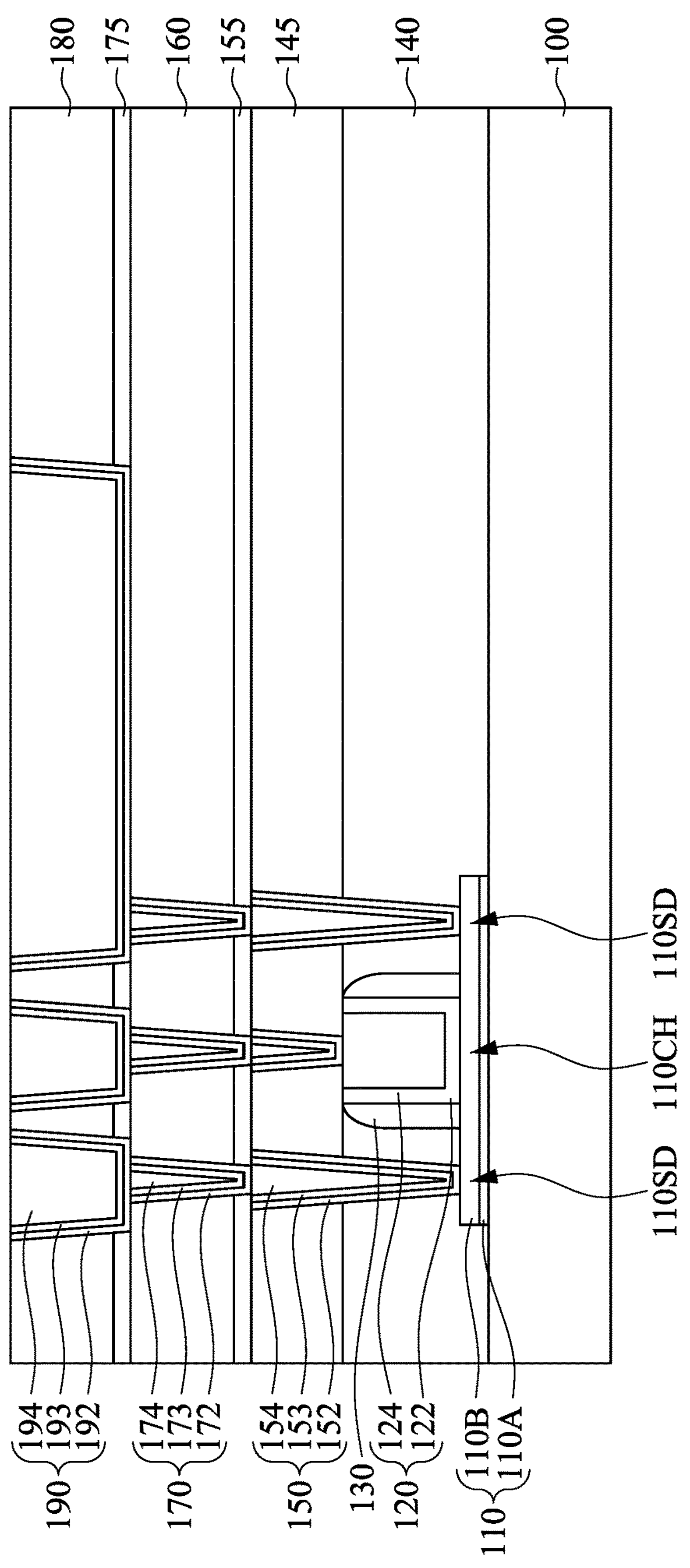

Reference is made to FIG. 15. An etch stop layer 175 is formed over the IMD layer 160, and an inter-metal dielectric (IMD) layer 180 is formed over the etch stop layer 175. The etch stop layer 175 and the IMD layer 180 may be similar to or the same as the etch stop layer 155 and the IMD layer 160, respectively, and thus relevant details will not be repeated for brevity.

Metal line structures 190 are formed in the IMD layer 180 and the etch stop layer 175, and may be in contact with the via structures 170, respectively. In some embodiments, each of the metal line structures 190 includes a 2-D material layer 192, a 2-D material layer 193 over the 2-D material layer 192, and an electrode layer 194 over the 2-D material layer 193. In some embodiments, the metal line structures 190 can be formed by a similar method as the via structures 170, for example, by patterning the IMD layer 180 and the etch stop layer 175 to form openings that expose the via structures 170, sequentially depositing layers of the 2-D material layer 192, the 2-D material layer 193, and the electrode layer 174 in the openings, and then performing a CMP process until the IMD layer 180. After the CMP process, the remaining 2-D material layer 192, the 2-D material layer 193, and the electrode layer 194 in each opening can be referred to as the metal line structure 190. In some embodiments, the 2-D material layer 192, the 2-D material layer 193, and the electrode layer 194 may be similar to or the same as the 2-D material layer 152/172, the 2-D material layer 153/173, and the electrode layer 154/174 as described above, respectively, and thus relevant details will not be repeated for brevity.

Here, the term "via structure" may be the portion having longest dimensions extending vertically, and the term "metal line structure" may be the portion having longest dimensions extending laterally, and thus the via structure 190 conduct current vertically and are used to electrically connect two conductive features located at vertically adjacent levels, whereas the metal line structure 190 conduct current laterally and are used to distribute electrical signals and power within one level.

FIGS. 16 to 19 are cross-sectional views of an integrated circuit structure in various stages of fabrication in accordance with some embodiments of the present disclosure. It is noted that some elements of FIGS. 16 to 19 may be similar to or the same as those described with respect to FIGS. 1A to 15, such elements are labeled the same, and relevant details will not be repeated.

Figure 16:
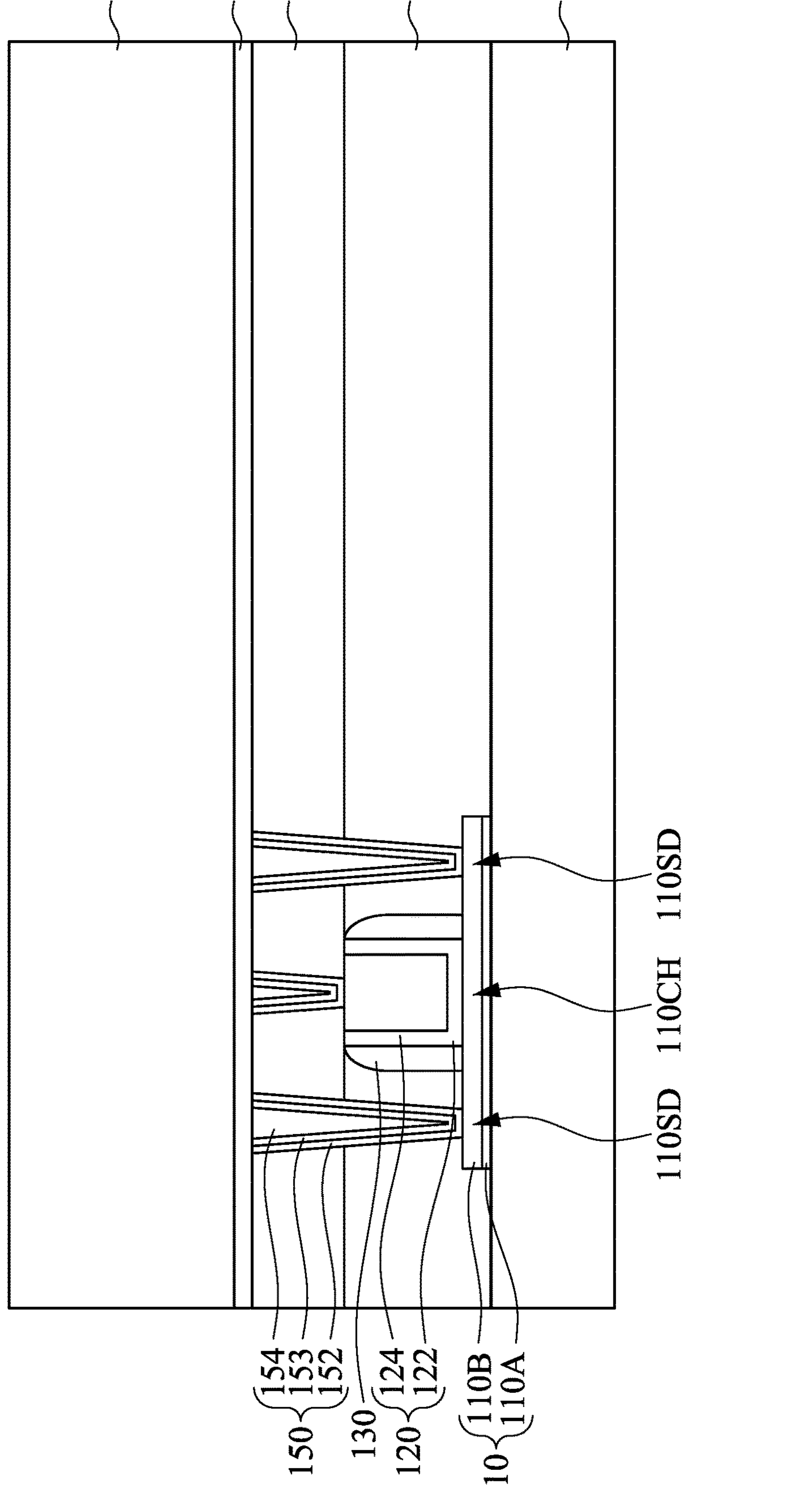

Reference is made to FIG. 16. An etch stop layer 205 is formed over the second ILD layer 145, and an inter-metal dielectric (IMD) layer 210 is formed over the etch stop layer 205. The etch stop layer 205 and the IMD layer 210 may be similar to or the same as the etch stop layer 155 and the IMD layer 160, respectively, and thus relevant details will not be repeated for brevity.

Figure 17:
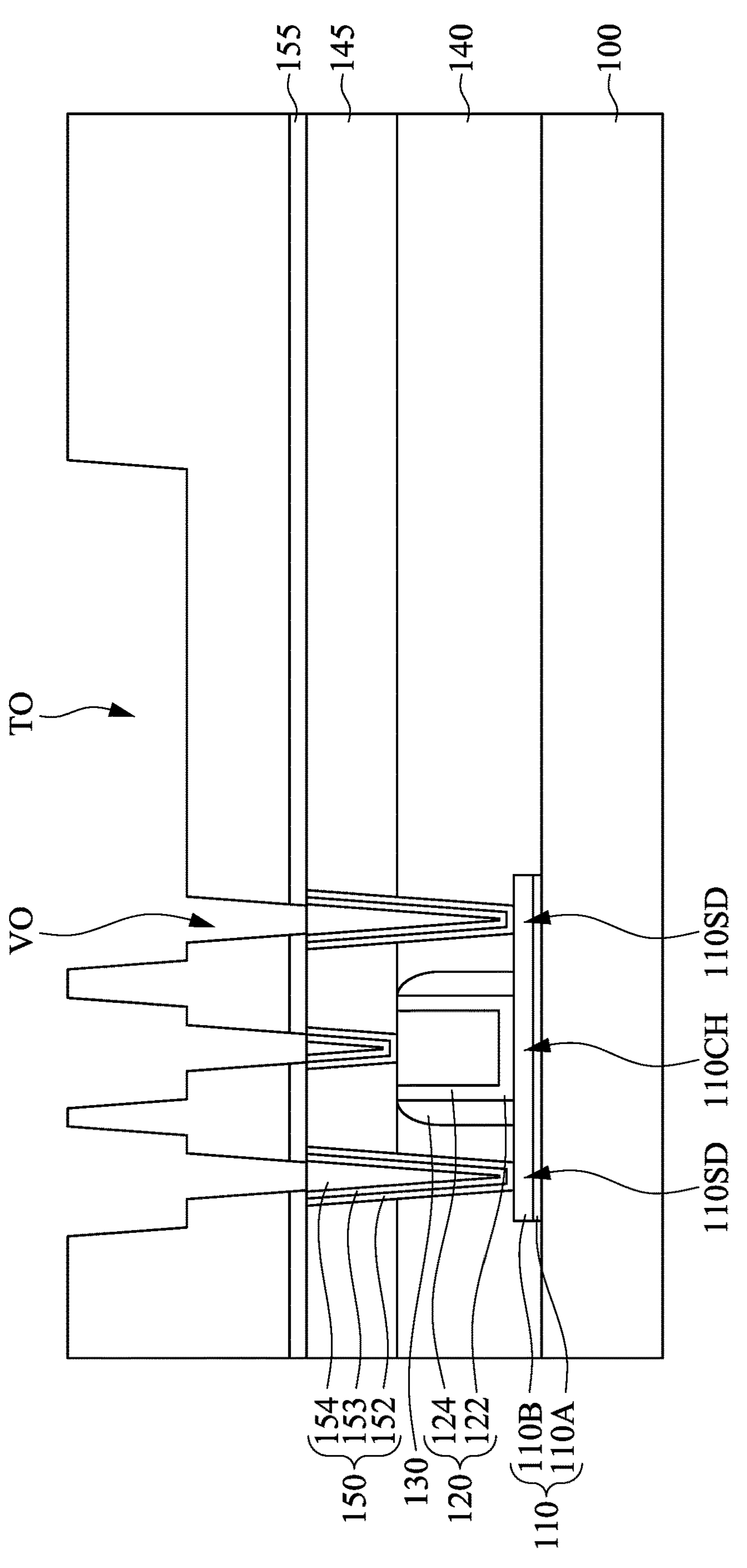

Reference is made to FIG. 17. The IMD layer 210 and the etch stop layer 205 are patterned to formed dual damascene openings, in which the dual damascene openings include trench openings TO and via openings VO, each trench opening TO is above and in spatial communication with one or more via openings VO. In some embodiment, a dual damascene techniques may include a "via-first" patterning method or a "trench-first" patterning method, and the trench openings TO and the via openings VO may be formed using a typical lithographic with masking technologies and anisotropic etch operation (e.g., plasma etching or reactive ion etching).

Figure 18:
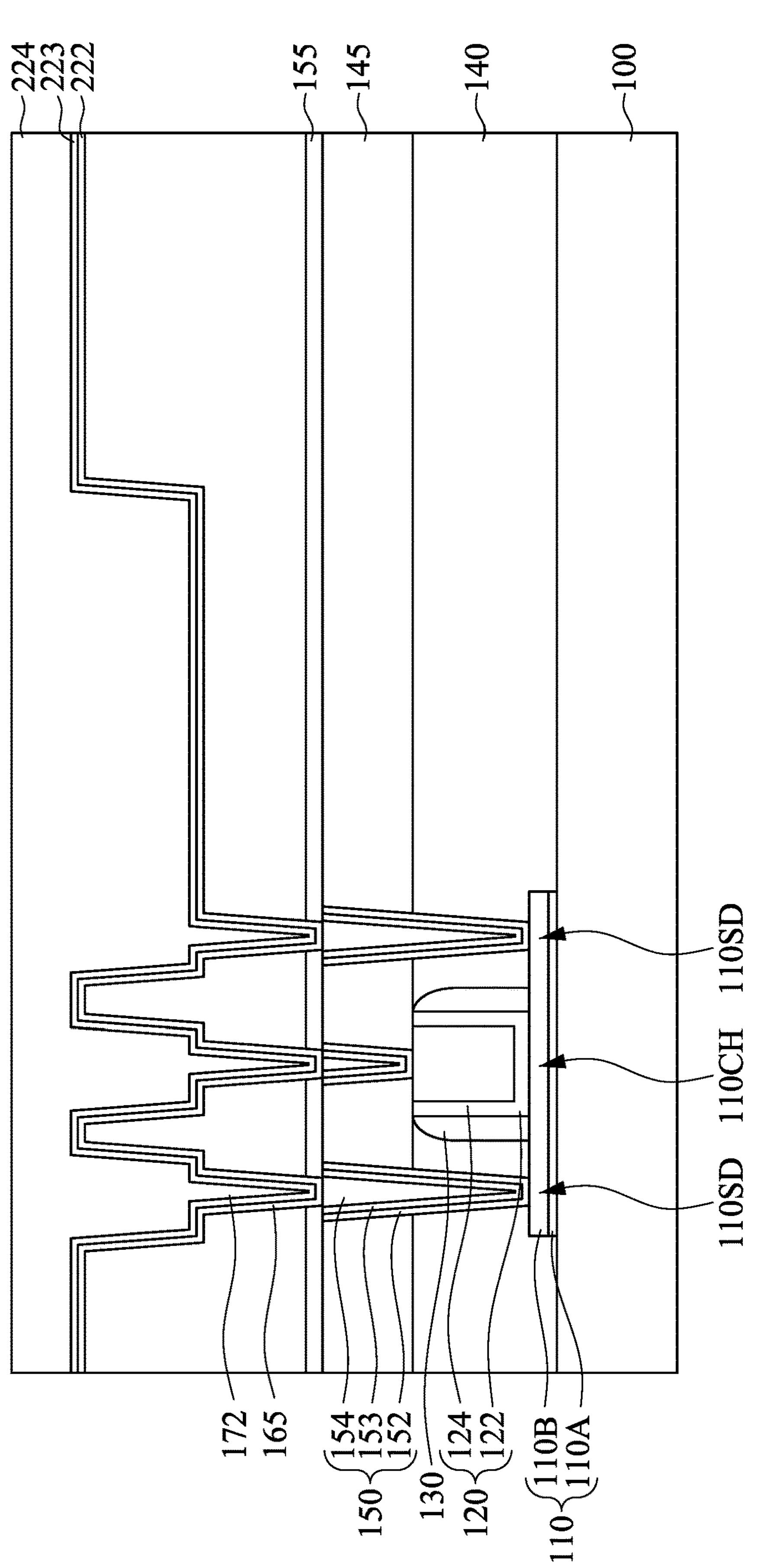

Reference is made to FIG. 18. A 2-D material layer 222, a 2-D material layer 223, and an electrode layer 224 are sequentially deposited over the IMD layer 210 and in the trench openings TO and the via openings VO. In some embodiments, the 2-D material layer 222, the 2-D material layer 223, and the electrode layer 224 may be similar to or the same as the 2-D material layer 152/172/192, the 2-D material layer 153/173/193, and the electrode layer 154/174/194 as described above, respectively, and thus relevant details will not be repeated for brevity.

Figure 19:
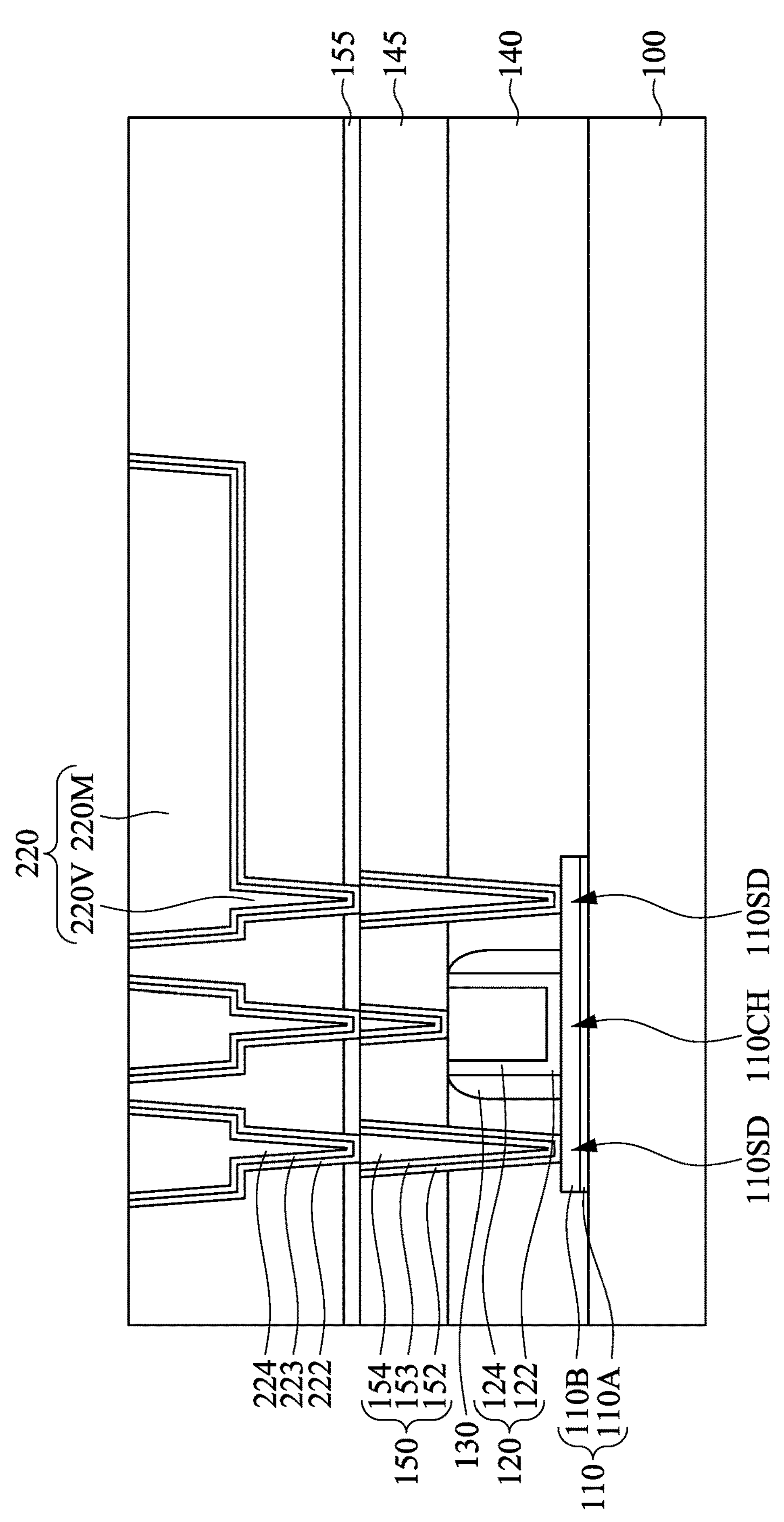

Reference is made to FIG. 19. A CMP process is performed to remove excess materials of the 2-D material layer 222, the 2-D material layer 223, and the electrode layer 224 until the IMD layer 210 is exposed. After the CMP process is complete, the interconnect structures 220 are formed, in which each of the interconnect structures 220 includes the remaining portions of the 2-D material layer 222, the 2-D material layer 223, and the electrode layer 224.

The each interconnect structures 220 has portions in the via openings VA and portions in the trench openings TO. In some embodiments, the portions of the interconnect structures 220 in the via openings VO can be referred to as via portions 220V that serve as metal vias to conduct current vertically between different interconnect levels, while the portions of the interconnect structures 220 in the trench openings TO can be referred to as metal line portions 220M that serve as metal lines to conduct current laterally and distribute electrical signals and power within a same level. Here, the term "via portion" may be the portion having longest dimensions extending vertically, and the term "metal line portion" may be the portion having longest dimensions extending laterally, and thus the via portions 220V conduct current vertically and are used to electrically connect two conductive features located at vertically adjacent levels, whereas the metal line portions 220M conduct current laterally and are used to distribute electrical signals and power within one level.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. Embodiments of the present disclosure provides a method for forming a 2-D material channel layer having a first 2-D material layer and a second 2-D material layer. By controlling the deposition condition of the second 2-D material layer, the crystallinity of the 2-D material channel layer can be improved, which in turn will improve the device performance. Embodiments of the present disclosure provides a method for forming an interconnect structure. The interconnect structure may include a first 2-D material layer, a second 2-D material layer, and an electrode layer. The first 2-D material layer can act as a diffusion barrier, and the second 2-D material layer can act as a liner of the electrode layer. By using the first and second 2-D material layers, the device scale can be further reduced.

In some embodiments of the present disclosure, a method includes performing a first deposition process to form a first graphene layer over a substrate, the first deposition process being performed under a first temperature and a first pressure; performing a second deposition process to form a second graphene layer over the first graphene layer, the second deposition process being performed under a second temperature and a second pressure, in which the first temperature is higher than the second temperature, and the first pressure is lower than the second pressure; forming a gate structure over the second graphene layer; and forming source/drain contacts on opposite sides of the gate structure and electrically connected to the first and second graphene layers.

In some embodiments, the first temperature is in a range from about 900° C. to about 1200° C., and the second temperature is in a range from about 850° C. to about 1000° C.

In some embodiments, the first deposition process and the second deposition process both are performed using precursors including Ar, $H_2$, and $C_2H_6$, and in which a flow rate of $H_2$ in the first deposition process is lower than a flow rate of $H_2$ in the second deposition process.

In some embodiments, the flow rate of $H_2$ in the first deposition process is in a range from about 0 sccm to about 100 sccm, and the flow rate of $H_2$ in the second deposition process is in a range from about 50 sccm to about 300 sccm.

In some embodiments, a flow rate of $C_2H_6$ in the first deposition process is substantially the same as a flow rate of $C_2H_6$ in the second deposition process, and a flow rate of Ar in the first deposition process is substantially the same as a flow rate of Ar in the second deposition process.

In some embodiments, the second graphene layer is thicker than the first graphene layer.

In some embodiments, each of the source/drain contacts includes a first 2-D material layer, a second 2-D material layer over the first 2-D material layer, and a metal layer over the second 2-D material layer, and the first 2-D material layer is made of a different material than the second 2-D material layer.

In some embodiments, the first 2-D material layer is made of graphene and the second 2-D material layer is made of transition metal dichalcogenide.

In some embodiments of the present disclosure, a method includes forming a transistor over a substrate; forming a dielectric layer over the transistor; patterning the dielectric layer to form an opening; depositing a first 2-D material layer over the dielectric layer and lining the opening; depositing a second 2-D material layer lining the first 2-D material layer, in which the second 2-D material layer is made of a different material than the first 2-D material layer; and depositing a metal layer over the second 2-D material layer; and performing a planarization process to the first 2-D material layer, the second 2-D material layer, and the metal layer to form an interconnect structure electrically connected to the transistor, in which the interconnect structure includes remaining portions of the first 2-D material layer, the second 2-D material layer, and the metal layer.

In some embodiments, the second 2-D material layer is made of a metal-containing material while the first 2-D material layer is made of a metal-free material.

In some embodiments, the first 2-D material layer is made of graphene and the second 2-D material layer is made of transition metal dichalcogenide.

In some embodiments, the transistor includes a 2-D material channel layer, and the 2-D material channel layer and the first 2-D material layer are made of a same material.

In some embodiments, forming the transistor includes depositing a first 2-D material channel layer over a substrate; depositing a second 2-D material channel layer over the first 2-D material channel layer, in which depositing the second 2-D material channel layer is performed under a lower temperature and a higher pressure than depositing the first 2-D material channel layer; and forming a gate structure over the second 2-D material channel layer.

In some embodiments, the first and second 2-D material channel layers are made of graphene.

In some embodiments, depositing the second 2-D material channel layer is performed using a higher flow rate of hydrogen than depositing the first 2-D material channel layer.

In some embodiments of the present disclosure, an integrated circuit includes a substrate, a transistor over the substrate, a dielectric layer over the transistor, and an interconnect structure in the dielectric layer and electrically connected to the transistor. The interconnect structure includes a first metal-free 2-D material layer, a first metal-containing 2-D material layer, and a first metal layer over the first metal-containing 2-D material layer.

In some embodiments, the first metal-free 2-D material layer is made of graphene, and the first metal-containing 2-D material layer is made of transition metal dichalcogenide.

In some embodiments, the transistor includes a 2-D material channel layer made of a same material as the first metal-free 2-D material layer and a gate structure over the 2-D material channel layer.

In some embodiments, the integrated circuit further includes a metal via electrically connecting the gate structure of the transistor to the interconnect structure. The metal via includes a second metal-free 2-D material layer, a second metal-containing 2-D material layer, and a second metal layer over the second metal-containing 2-D material layer.

In some embodiments, the first metal-free 2-D material layer is a single monolayer 2-D material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

performing a first deposition process to form a first graphene layer over a substrate, the first deposition process being performed under a first temperature and a first pressure;

performing a second deposition process to form a second graphene layer over the first graphene layer, the second deposition process being performed under a second temperature and a second pressure, wherein the first temperature is higher than the second temperature, and the first pressure is lower than the second pressure, wherein the first deposition process and the second deposition process both are performed using precursors comprising Ar, $H_2$, and $C_2H_6$, and wherein a flow rate of $H_2$ in the first deposition process is lower than a flow rate of $H_2$ in the second deposition process;

forming a gate structure over the second graphene layer; and forming source/drain contacts on opposite sides of the gate structure and electrically connected to the first and second graphene layers.

2. The method of claim 1, wherein the first temperature is in a range from about 900° C. to about 1200° C., and the second temperature is in a range from about 850° C. to about 1000° C.

3. The method of claim 1, wherein the flow rate of $H_2$ in the first deposition process is in a range from about 0 sccm to about 100 sccm, and the flow rate of $H_2$ in the second deposition process is in a range from about 50 sccm to about 300 sccm.

4. The method of claim 1, wherein a flow rate of $C_2H_6$ in the first deposition process is substantially the same as a flow rate of $C_2H_6$ in the second deposition process, and a flow rate of Ar in the first deposition process is substantially the same as a flow rate of Ar in the second deposition process.

5. The method of claim 1, wherein the second graphene layer is thicker than the first graphene layer.

6. A method, comprising:

forming a transistor over a substrate;

forming a dielectric layer over the transistor;

patterning the dielectric layer to form an opening;

depositing a first 2-D material layer over the dielectric layer and lining the opening;

depositing a second 2-D material layer lining the first 2-D material layer, wherein the second 2-D material layer is made of a different material than the first 2-D material layer, wherein the second 2-D material layer is made of a metal-containing material, wherein a bottom surface of the second 2-D material layer is higher than a bottom surface of the first 2-D material layer, and wherein the first 2-D material layer interfaces with a top surface of a channel layer of the transistor and the bottom surface of the second 2-D material layer;

depositing a metal layer over the second 2-D material layer; and performing a planarization process to the first 2-D material layer, the second 2-D material layer, and the metal layer to form an interconnect structure electrically connected to the transistor, wherein the interconnect structure comprises remaining portions of the first 2-D material layer, the second 2-D material layer, and the metal layer.

7. The method of claim 6, wherein the first 2-D material layer is made of a metal-free material.

8. The method of claim 6, wherein the first 2-D material layer is made of graphene and the second 2-D material layer is made of transition metal dichalcogenide.

9. The method of claim 6, wherein the transistor comprises a 2-D material channel layer, and the 2-D material channel layer and the first 2-D material layer are made of a same material.

10. The method of claim 6, wherein forming the transistor comprises:

depositing a first 2-D material channel layer over the substrate;

depositing a second 2-D material channel layer over the first 2-D material channel layer, wherein depositing the second 2-D material channel layer is performed under a lower temperature and a higher pressure than depositing the first 2-D material channel layer; and forming a gate structure over the second 2-D material channel layer.

11. The method of claim 10, wherein the first and second 2-D material channel layers are made of graphene.

12. The method of claim 10, wherein depositing the second 2-D material channel layer is performed using a higher flow rate of hydrogen than depositing the first 2-D material channel layer.

13. A method, comprising:

forming a transistor over a substrate, wherein the transistor comprises a 2-D material channel layer;

forming a dielectric layer over the transistor; and forming a contact in the dielectric layer and electrically connected to the transistor, wherein the contact comprises:

a first metal-free 2-D material layer interfacing with the 2-D material channel layer of the transistor;

a first metal-containing 2-D material layer; and a first metal layer over the first metal-containing 2-D material layer, wherein the first metal layer has a dual damascene structure comprising a via portion and a metal line portion over the via portion, the metal line portion being wider than the via portion, and the first metal-containing 2-D material layer has a horizontal portion interfacing with a bottom surface of the metal line portion.

14. The method of claim 13, wherein the first metal-free 2-D material layer is made of graphene, and the first metal-containing 2-D material layer is made of transition metal dichalcogenide.

15. The method of claim 13, wherein the transistor comprises:

a 2-D material channel layer made of a same material as the first metal-free 2-D material layer; and a gate structure over the 2-D material channel layer.

16. The method of claim 15, further comprising forming a metal via electrically connecting the gate structure of the transistor to the contact, wherein the metal via comprises:

a second metal-free 2-D material layer;

a second metal-containing 2-D material layer; and a second metal layer over the second metal-containing 2-D material layer.

17. The method of claim 13, wherein the first metal-free 2-D material layer is a single monolayer 2-D material.

18. The method of claim 1, further comprising:

forming an etch stop layer over and interfacing with the source/drain contacts;

forming an inter-metal dielectric (IMD) layer over the etch stop layer; and forming a via structure in the IMD layer and the etch stop layer and comprising:

a first graphene barrier layer; and a first transition metal dichalcogenide (TMD) layer over the first graphene barrier layer, wherein the first graphene barrier layer covers three sides of the first TMD layer; and a first electrode layer over the first TMD layer.

19. The method of claim 18, wherein one of the source/drain contacts comprises:

a second graphene barrier layer;

a second transition metal dichalcogenide (TMD) layer over the second graphene barrier layer, wherein the second graphene barrier layer covers three sides of the second TMD layer, wherein the etch stop layer interfaces with the second graphene barrier layer and the second TMD layer; and a second electrode layer over the first TMD layer.

20. The method of claim 19, wherein the first graphene layer of the via structure interfaces with the second electrode layer of the one of the source/drain contacts.

* * * * *